US006537730B1

(12) United States Patent
Fleming et al.

(10) Patent No.: US 6,537,730 B1
(45) Date of Patent: Mar. 25, 2003

(54) THERMAL IMAGING COMPOSITION AND MEMBER CONTAINING SULFONATED IR DYE AND METHODS OF IMAGING AND PRINTING

(75) Inventors: James C. Fleming, Webster, NY (US); Jeffrey W. Leon, Rochester, NY (US); David A. Stegman, Churchville, NY (US); Kevin W. Williams, Rochester, NY (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 280 days.

(21) Appl. No.: 09/652,344

(22) Filed: Aug. 31, 2000

Related U.S. Application Data

(62) Division of application No. 09/387,021, filed on Aug. 31, 1999, now Pat. No. 6,159,657.

(51) Int. Cl.[7] .......................... G03F 7/038; G03F 7/20; G03C 1/77; B41N 1/08; B41N 1/20

(52) U.S. Cl. ................ 430/302; 430/270.1; 430/281.1; 430/287.1; 430/905; 430/907; 430/926; 430/944; 430/945; 101/454; 101/456; 101/457; 101/465; 101/466; 101/467; 101/450.1

(58) Field of Search .......................... 430/270.1, 281.1, 430/287.1, 302, 944, 945, 907, 905, 926; 101/450.1, 454, 456, 457, 465, 466, 467

(56) References Cited

U.S. PATENT DOCUMENTS

| | | | | |
|---|---|---|---|---|
| 4,034,183 A | 7/1977 | Uhlig | | 219/122 LM |
| 4,081,572 A | 3/1978 | Pacansky | | 427/53 |
| 4,405,705 A | 9/1983 | Etoh et al. | | 430/270.1 |
| 4,548,893 A | 10/1985 | Lee et al. | | 430/296 |
| 4,634,659 A | 1/1987 | Esumi et al. | | 430/302 |
| 4,693,958 A | 9/1987 | Schwartz et al. | | 430/302 |
| 4,882,265 A | 11/1989 | Laganis et al. | | 430/522 |
| 5,107,063 A | 4/1992 | West et al. | | 548/455 |
| 5,339,737 A | 8/1994 | Lewis et al. | | 101/454 |
| 5,353,705 A | 10/1994 | Lewis et al. | | 101/453 |
| 5,378,580 A | 1/1995 | Leenders | | 430/303 |
| 5,385,092 A | 1/1995 | Lewis et al. | | 101/467 |
| 5,512,418 A | 4/1996 | Ma | | 430/270.1 |
| RE35,512 E | 5/1997 | Nowak et al. | | 101/454 |
| 5,713,287 A | 2/1998 | Gelbart | | 101/467 |
| 6,410,202 B1 * | 6/2002 | Fleming et al. | | 430/270.1 |

FOREIGN PATENT DOCUMENTS

| | | |
|---|---|---|
| EP | 0 251 282 | 1/1988 |
| EP | 0 652 483 A1 | 5/1995 |
| WO | 92/09934 | 6/1992 |

OTHER PUBLICATIONS

*Research Disclosure*, Item 19201, Apr., 1980.

* cited by examiner

*Primary Examiner*—Janet Baxter
*Assistant Examiner*—Sin J. Lee
(74) *Attorney, Agent, or Firm*—Faegre & Benson LLP

(57) ABSTRACT

An imaging member, such as a negative-working printing plate or on-press cylinder, can be prepared with a hydrophilic imaging layer comprised of a heat-sensitive hydrophilic polymer having ionic moieties and an infrared radiation sensitive dye having multiple sulfo groups. The heat-sensitive polymer and IR dye can be formulated in water or water-miscible solvents to provide highly thermal sensitive imaging compositions. In the imaging member, the polymer reacts to provide increased hydrophobicity in areas exposed to energy that provides or generates heat. For example, heat can be supplied by laser irradiation in the IR region of the electromagnetic spectrum. The heat-sensitive polymer is considered "switchable" in response to heat, and provides a lithographic image without wet processing.

21 Claims, No Drawings

THERMAL IMAGING COMPOSITION AND MEMBER CONTAINING SULFONATED IR DYE AND METHODS OF IMAGING AND PRINTING

CROSS-REFERENCE TO RELATED APPLICATION

This is a Divisional of application Ser. No. 09/387,021 filed Aug. 31, 1999, U.S. Pat. No. 6,159,657, now allowed.

FIELD OF THE INVENTION

This invention relates in general to thermal imaging compositions, and to lithographic imaging members (particularly lithographic printing plates) prepared therefrom. The invention also relates to a method of imaging such imaging members, and to a method of printing using them.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared surface is moistened with water and ink is then applied, the background or non-imaged areas retain the water and repel the ink while the imaged areas accept the ink and repel the water. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are becoming more common. Examples of such plates are described in U.S. Pat. No. 5,372,915 (Haley et al). They include an imaging layer comprising a mixture of dissolvable polymers and an infrared radiation absorbing compound. While these plates can be imaged using lasers and digital information, they require wet processing using alkaline developer solutions.

It has been recognized that a lithographic printing plate could be created by ablating an IR absorbing layer. For example, Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a $Nd^{++}$YAG laser. The absorbing layer converted the infrared energy to heat thus partially loosening, vaporizing or ablating the absorber layer and the overlying silicone rubber. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing. Other publications describing ablatable printing plates include U.S. Pat. No. 5,385,092 (Lewis et al), U.S. Pat. No. 5,339,737 (Lewis et al), U.S. Pat. No. 5,353,705 (Lewis et al), U.S. Reissue Pat. No. 35,512 (Nowak et al), and U.S. Pat. No. 5,378,580 (Leenders).

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable for resulting printing quality. Such plates generally require at least two coated layers on a support.

Thermally switchable polymers have been described for use as imaging materials in printing plates. By “switchable” is meant that the polymer is rendered from hydrophobic to relatively more hydrophilic or, conversely from hydrophilic to relatively more hydrophobic, upon exposure to heat. U.S. Pat. No. 4,034,183 (Uhlig) describes the use of high powered lasers to convert hydrophilic surface layers to hydrophobic surfaces. A similar process is described for converting polyamic acids into polyimides in U.S. Pat. No. 4,081,572 (Pacansky). The use of high-powered lasers is undesirable in the industry because of their high electrical power requirements and because of their need for cooling and frequent maintenance.

U.S. Pat. No. 4,634,659 (Esumi et al) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate’s use is in a positive-working mode only.

U.S. Pat. No. 4,405,705 (Etoh et al) and U.S. Pat. No. 4,548,893 (Lee et al) describe amine-containing polymers for photosensitive materials used in non-thermal processes. Thermal processes using polyamic acids and vinyl polymers with pendant quaternary ammonium groups are described in U.S. Pat. No. 4,693,958 (Schwartz et al). U.S. Pat. No. 5,512,418 (Ma) describes the use of polymers having cationic quaternary ammonium groups that are heat-sensitive. However, the materials described in this art require wet processing after imaging.

WO 92/09934 (Vogel et al) describes photosensitive compositions containing a photoacid generator and a polymer with acid labile tetrahydropyranyl or activated ester groups. However, imaging of these compositions converts the imaged areas from hydrophobic to hydrophilic in nature.

In addition, EP-A 0 652 483 (Ellis et al) describes lithographic printing plates imageable using IR lasers, and which do not require wet processing. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups. Imaging such compositions converts the imaged areas from hydrophobic to relatively more hydrophilic in nature, and thus requires imaging the background of the plate, which is generally a larger area. This can be a problem when imaging to the edge of the printing plate is desired.

Copending U.S. Ser. No. 09/162,905 filed on Sep. 29, 1998, U.S. Ser. No. 09/163,020 filed on Sep. 29, 1998, U.S. Ser. No. 09/309,999 filed May 11, 1999, U.S. Ser. No. 09/310,038 filed May 11, 1999, and U.S. Ser. No. 09/156,833 filed on Sep. 18, 1998 are directed to processless direct write printing plates that include an imaging layer containing heat sensitive polymers. The polymer coatings are sensitized to infrared radiation by the incorporation of an infrared absorbing material such as an organic dye or a fine dispersion of carbon black. Upon exposure to a high intensity infrared laser, light absorbed by the organic dye or carbon black is converted to heat, thereby promoting a physical change in the polymer (usually a change in hydrophilicity or hydrophobicity). The resulting printing plates can be used on conventional printing presses to provide, for example, negative images. Such printing plates have utility in the evolving "computer-to-plate" printing market.

Some of the heat-sensitive polymers described in the copending applications, particularly the polymers containing organoonium or other charged groups, have a tendency to undergo physical interactions or chemical reactions with the organic dye or carbon black, thus compromising the effectiveness of both polymers and heat-absorbing materials. In particular, while carbon black is an infrared radiation absorbing material of preference because of its low cost and absorption of light throughout the infrared region of the electromagnetic spectrum, its use also creates problems. For example, it cannot be readily dispersed out of water or the alcoholic solvents of choice. Special carbon black products that are designed to be water-dispersible (that is, have special surface functionalities), however, often agglomerate in the presence of polymers (including organoonium polymers) containing ionic groups due to chemical interactions.

Organic dye salts, by nature, are often partially soluble in water or alcoholic coating solvents and are thus preferred as IR dye sensitizers. However, many such salts have been found to be unacceptable because of insufficient solubility, because they react with the charged polymer to form hydrophobic products that can result in scummed or toned images, or because they offer insufficient thermal sensitization in imaging members having aluminum supports.

These problems were overcome using the imaging compositions described in copending and commonly assigned U.S. Ser. No. 09/387,116 filed on even date herewith by us, and entitled THERMAL SWITCHABLE COMPOSITION AND IMAGING MEMBER CONTAINING CATIONIC IR DYE AND METHODS OF IMAGING AND PRINTING. While the invention described in that application represents an important advance in the art, further improvement is needed. Specifically, it was observed that the quaternary ammonium IR dyes described in that application may sometimes be washed out of the coated imaging layer by a fountain solution used during printing.

Thus, the graphic arts industry is seeking an alternative means for providing processless, direct-write lithographic imaging members that can be imaged without ablation, or the other problems noted above in relation to known processless direct write printing plates. It would also be desirable to have heat-sensitive imaging members that include IR dye sensitizers that are highly effective to convert light exposure into heat, that can be coated out of water or other environmentally suitable solvents, and that remain in the coated imaging layers during printing.

SUMMARY OF THE INVENTION

The problems noted above are overcome with a composition useful for thermal imaging comprising:

a) a hydrophilic heat-sensitive ionomer, b) water or a water-miscible organic solvent, and c) an infrared radiation sensitive dye that is soluble in water or the water-miscible organic solvent, and has at least three sulfo groups.

This invention also provides an imaging member comprising a support and having disposed thereon a hydrophilic heat-sensitive layer that is prepared from the composition described above.

Still further, this invention includes a method of imaging comprising the steps of:

A) providing the imaging member described above, and

B) imagewise exposing the imaging member to provide exposed and unexposed areas in the imaging layer of the imaging member, whereby the exposed areas are rendered more hydrophobic than the unexposed areas by heat provided by the imagewise exposure.

Still again, a method of printing comprises the steps of carrying out steps A and B noted above, and additionally:

C) contacting the imaging member with a fountain solution and a lithographic printing ink, and imagewise transferring that printing ink from the imaging member to a receiving material.

As used herein, the term "ionomer" refers to a charged polymer having at least 20 mol % of the recurring units negatively or positively charged. These ionomers are generally referred to as "charged polymers" in the following disclosure.

The imaging members of this invention have a number of advantages, and avoid the problems of previous printing plates. Specifically, the problems and concerns associated with ablation imaging (that is, imagewise removal of a surface layer) are avoided because the hydrophilicity of the imaging layer is changed imagewise by "switching" (preferably, irreversibly) exposed areas of its printing surface to be less hydrophilic (that is, become more hydrophobic when heated). Thus, the imaging layer stays intact during and after imaging (that is, no ablation occurs). These advantages are achieved by using a hydrophilic heat-sensitive polymer having recurring ionic groups within the polymer backbone or chemically attached thereto. Such polymers and groups are described in more detail below. The polymers used in the imaging layer are readily prepared using procedures described herein, and the imaging members of this invention are simple to make and use without the need for post-imaging wet processing. The resulting printing members formed from the imaging members of this invention are generally negative-working in nature. In some cases, the polymers are crosslinked upon exposure and provide increased durability to the imaging members. In other and preferred cases, the polymers are crosslinked upon application to a support and curing.

Positively charged polymers, such as organoonium polymers that are preferred in the practice of this invention are typically coated out of water and methanol, solvents that readily dissolve these water-soluble polymeric salts.

The organic aromatic infrared radiation-sensitive dyes ("IR dyes" herein) used in this invention are desired sensitizers for thermal imaging members because they can be selected to have maximum absorption at the operating wavelength of a laser platesetter (generally 700 nm or more). Moreover, they can be coated in a dissolved (that is molecularly dispersed) state, providing for maximized utilization of energy as well as maximized image resolution capability. Water and alcoholic solvents used for dissolving the positively charged polymers also readily dissolve the organic IR dyes because of the multiple sulfo groups on the dye molecule. Thus, homogeneous compositional coatings are possible on any type of imaging member support, including aluminum supports. Furthermore, we have not observed adverse effects that normally accompany an interaction of the polymers and the IR dyes described herein. In addition, printed images from use of this invention are free of scum or background toning, and the IR dyes are not washed out by conventional fountain solutions used during printing.

DETAILED DESCRIPTION OF THE INVENTION

The imaging members of this invention comprise a support and one or more layers thereon that include a dried heat-sensitive composition. The support can be any self-supporting material including polymeric films, glass, ceramics, cellulosic materials (including papers), metals or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 $\mu$m. Another preferred embodiment uses aluminum sheets having a thickness of from about 100 to about 600 $\mu$m. The support should resist dimensional change under conditions of use.

The support may also be a cylindrical support that includes printing cylinders on press as well as printing sleeves that are fitted over printing cylinders. The use of such supports to provide cylindrical imaging members is described in U.S. Pat. No. 5,713,287 (Gelbart). The heat-sensitive polymer composition can be coated or sprayed directly onto the cylindrical surface that is an integral part of the printing press.

The support may be coated with one or more "subbing" layers to improve adhesion of the final assemblage. Examples of subbing layer materials include, but are not limited to, gelatin and other naturally occurring and synthetic hydrophilic colloids and vinyl polymers (such as vinylidene chloride copolymers) that are known for such purposes in the photographic industry, vinylphosphonic acid polymers, sol gel materials such as those prepared from alkoxysilanes (including glycidoxypropyltriethoxysilane and aminopropyltriethoxysilane), epoxy functional polymers, and various ceramics.

The backside of the support may be coated with antistatic agents and/or slipping layers or matte layers to improve handling and "feel" of the imaging member.

The imaging members, however, preferably have only one layer on the support, that is a heat-sensitive surface layer that is required for imaging. This hydrophilic layer is prepared from a composition of this invention and includes one or more heat-sensitive charged polymers and an aromatic IR dye as a photothermal conversion material (both described below). Because of the particular polymer(s) used in the imaging layer, the exposed (imaged) areas of the layer are rendered more hydrophobic in nature. The unexposed areas remain hydrophilic in nature.

In the heat-sensitive imaging layer of the imaging member, only the one or more charged polymers and one or more aromatic IR dyes are essential for imaging. The charged polymers generally are comprised of recurring units, of which at least 20 mol % include ionic groups. Preferably, at least 30 mol % of the recurring groups include ionic groups. Thus each of these polymers has a net charge provided by these ionic groups. Preferably, the ionic groups are cationic groups.

The charged polymers (ionomers) useful in the practice of this invention can be in any of two broad classes of materials:

I) crosslinked or uncrosslinked vinyl polymers comprising recurring units comprising positively-charged, pendant N-alkylated aromatic heterocyclic groups, and II) crosslinked or uncrosslinked polymers comprising recurring organoonium groups.

Each class of polymers is described in turn. The imaging layer can include mixtures of polymers from each class, or a mixture of one or more polymers from both classes. The Class II polymers are preferred.

Class I Polymers

The Class I polymers generally have a molecular weight of at least 1000 and can be any of a wide variety of hydrophilic vinyl homopolymers and copolymers having the requisite positively-charged groups. They are prepared from ethylenically unsaturated polymerizable monomers using any conventional polymerization technique. Preferably, the polymers are copolymers prepared from two or more ethylenically unsaturated polymerizable monomers, at least one of which contains the desired pendant positively-charged group, and another monomer that is capable of providing other properties, such as crosslinking sites and possibly adhesion to the support. Procedures and reactants needed to prepare these polymers are well known. With the additional teaching provided herein, the known polymer reactants and conditions can be modified by a skilled artisan to attach a suitable cationic group.

The presence of a cationic group apparently provides or facilitates the "switching" of the imaging layer from hydrophilic to hydrophobic in the areas that have been exposed to heat in some manner, when the cationic group reacts with its counterion. The net result is the loss of charge. Such reactions are more easily accomplished when the anion is more nucleophilic and/or more basic. For example, an acetate anion is typically more reactive than a chloride anion. By varying the chemical nature of the anion, the reactivity of the heat-sensitive polymer can be modified to provide optimal image resolution for a given set of conditions (for example, laser hardware and power, and printing press needs) balanced with sufficient ambient shelf life. Useful anions include the halides, carboxylates, sulfates, borates and sulfonates. Representative anions include, but are not limited to, chloride, bromide, fluoride, acetate, tetrafluoroborate, formate, sulfate, p-toluenesulfonate and others readily apparent to one skilled in the art. The halides and carboxylates are preferred.

The aromatic cationic group is present in sufficient recurring units of the polymer so that the heat-activated reaction described above can provide desired hydrophobicity of the imaged printing layer. The groups can be attached along a principal backbone of the polymer, or to one or more branches of a polymeric network, or both. The aromatic groups generally comprise 5 to 10 carbon, nitrogen, sulfur or oxygen atoms in the ring (at least one being a positively-charged nitrogen atom), to which is attached a branched or unbranched, substituted or unsubstituted alkyl group. Thus, the recurring units containing the aromatic heterocyclic group can be represented by the Structure I:

I

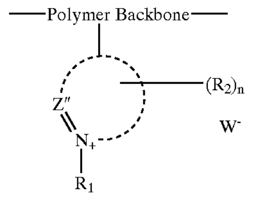

In this structure, $R_1$ is a branched or unbranched, substituted or unsubstituted alkyl group having from 1 to 12 carbon atoms (such as methyl, ethyl, n-propyl, isopropyl, t-butyl, hexyl, methoxymethyl, benzyl, neopentyl and dodecyl). Preferably, $R_1$ is a substituted or unsubstituted, branched or unbranched alkyl group having from 1 to 6 carbon atoms, and most preferably, it is substituted or unsubstituted methyl group.

$R_2$ can be a substituted or unsubstituted alkyl group (as defined above, and additionally a cyanoalkyl group, a hydroxyalkyl group or alkoxyalkyl group), substituted or unsubstituted alkoxy having 1 to 6 carbon atoms (such as methoxy, ethoxy, isopropoxy, oxymethylmethoxy, n-propoxy and butoxy), a substituted or unsubstituted aryl group having 6 to 14 carbon atoms in the ring (such as phenyl, naphthyl, anthryl, p-methoxyphenyl, xylyl, and alkoxycarbonylphenyl), halo (such as chloro and bromo), a substituted or unsubstituted cycloalkyl group having 5 to 8 carbon atoms in the ring (such as cyclopentyl, cyclohexyl and 4-methylcyclohexyl), or a substituted or unsubstituted heterocyclic group having 5 to 8 atoms in the ring including at least one nitrogen, sulfur or oxygen atom in the ring (such as pyridyl, pyridinyl, tetrahydrofuranyl and tetrahydropyranyl). Preferably, $R_2$ is substituted or unsubstituted methyl or ethyl group.

Z" represents the carbon and any additional nitrogen, oxygen, or sulfur atoms necessary to complete the 5- to 10-membered aromatic N-heterocyclic ring that is attached to the polymeric backbone. Thus, the ring can include two or more nitrogen atoms in the ring (for example, N-alkylated diazinium or imidazolium groups), or N-alkylated nitrogen-containing fused ring systems including, but not limited to, pyridinium, quinolinium, isoquinolinium acridinium, phenanthradinium and others readily apparent to one skilled in the art.

$W^-$ is a suitable anion as described above. Most preferably it is acetate or chloride.

Also in Structure I, n is defined as 0 to 6, and is preferably 0 or 1. Most preferably, n is 0.

The aromatic heterocyclic ring can be attached to the polymeric backbone at any position on the ring. Preferably, there are 5 or 6 atoms in the ring, one or two of which are nitrogen. Thus, the N-alkylated nitrogen containing aromatic group is preferably imidazolium or pyridinium and most preferably it is imidazolium.

The recurring units containing the cationic aromatic heterocycle can be provided by reacting a precursor polymer containing unalkylated nitrogen containing heterocyclic units with an appropriate alkylating agent (such as alkyl sulfonate esters, alkyl halides and other materials readily apparent to one skilled in the art) using known procedures and conditions.

Preferred Class I polymers can be represented by the following Structure II:

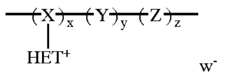

II wherein X represents recurring units to which the N-alkylated nitrogen containing aromatic heterocyclic groups (represented by $HET^+$) are attached, Y represents recurring units derived from ethylenically unsaturated polymerizable monomers that may provide active sites for crosslinking using any of various crosslinking mechanisms (described below), and Z represents recurring units derived from any additional ethylenically unsaturated polymerizable monomers. The various repeating units are present in suitable amounts, as represented by x being from about 20 to 100 mol %, y being from about 0 to about 20 mol %, and z being from 0 to 80 mol %. Preferably, x is from about 30 to about 98 mol %, y is from about 2 to about 10 mol % and z is from 0 to about 68 mol %.

Crosslinking of the polymers can be provided in a number of ways. There are numerous monomers and methods for crosslinking that are familiar to one skilled in the art. Some representative crosslinking strategies include, but are not necessarily limited to:

a) reacting an amine or carboxylic acid or other Lewis basic units with diepoxide crosslinkers, b) reacting an epoxide units within the polymer with difunctional amines, carboxylic acids, or other difunctional Lewis basic unit, c) irradiative or radical-initiated crosslinking of double bond-containing units such as acrylates, methacrylates, cinnamates, or vinyl groups, d) reacting a multivalent metal salts with ligating groups within the polymer (the reaction of zinc salts with carboxylic acid-containing polymers is an example), e) using crosslinkable monomers that react via the Knoevenagel condensation reaction, such as (2-acetoacetoxy)ethyl acrylate and methacrylate, f) reacting an amine, thiol, or carboxylic acid groups with a divinyl compound (such as bis (vinylsulfonyl) methane) via a Michael addition reaction, g) reacting a carboxylic acid units with crosslinkers having multiple aziridine units, h) reacting a crosslinkers having multiple isocyanate units with amines, thiols, or alcohols within the polymer, i) mechanisms involving the formation of interchain sol-gel linkages [such as the use of the 3-(trimethoxysilyl) propylmethacrylate monomer], j) oxidative crosslinking using an added radical initiator (such as a peroxide or hydroperoxide), k) autooxidative crosslinking, such as employed by alkyd resins, l) sulfur vulcanization, and m) processes involving ionizing radiation.

Monomers having crosslinkable groups or active crosslinkable sites (or groups that can serve as attachment points for crosslinking additives, such as epoxides) can be copolymerized with the other monomers noted above. Such monomers include, but are not limited to, 3-(trimethoxysilyl)propyl acrylate or methacrylate, cinnamoyl acrylate or methacrylate, N-methoxymethyl methacrylamide, N-aminopropylacrylamide hydrochloride, acrylic or methacrylic acid and hydroxyethyl methacrylate.

Additional monomers that provide the repeating units represented by "Z" in the Structure II above include any useful hydrophilic or oleophilic ethylenically unsaturated polymerizable monomer that may provide desired physical or printing properties to the hydrophilic imaging layer. Such monomers include, but are not limited to, acrylates, methacrylates, isoprene, acrylonitrile, styrene and styrene derivatives, acrylamides, methacrylamides, acrylic or methacrylic acid and vinyl halides.

Representative Class I polymers. are identified hereinbelow as Polymers 1 and 3–6. Mixtures of these polymers can also be used. Polymer 2 below is a precursor to a useful Class I polymer.

Class II Polymers

The Class II polymers also generally have a molecular weight of at least 1000. They can be any of a wide variety of vinyl or non-vinyl homopolymers and copolymers.

Non-vinyl polymers of Class II include, but are not limited to, polyesters, polyamides, polyamide-esters, polyarylene oxides and derivatives thereof, polyurethanes, polyxylylenes and derivatives thereof, silicon-based sol gels (solsesquioxanes), polyamidoamines, polyimides, polysulfones, polysiloxanes, polyethers, poly(ether ketones), poly(phenylene sulfide) ionomers, polysulfides and polybenzimidazoles. Preferably, such non-vinyl polymers are silicon based sol gels, polyarylene oxides, poly (phenylene sulfide) ionomers or polyxylylenes, and most preferably, they are poly(phenylene sulfide) ionomers. Procedures and reactants needed to prepare all of these types of polymers are well known. With the additional teaching provided herein, the known polymer reactants and conditions can be modified by a skilled artisan to incorporate or attach a suitable cationic organoonium moiety.

Silicon-based sol gels useful in this invention can be prepared as a crosslinked polymeric matrix containing a silicon colloid derived from di-, tri- or tetraalkoxy silanes. These colloids are formed by methods described in U.S. Pat. Nos. 2,244,325, 2,574,902 and 2,597,872. Stable dispersions of such colloids can be conveniently purchased from companies such as the DuPont Company. A preferred sol-gel uses N-trimethoxysilylpropyl-N,N,N-trimethylammonium acetate both as the crosslinking agent and as the polymer layer forming material.

The presence of an organoonium moiety that is chemically incorporated into the polymer in some fashion apparently provides or facilitates the "switching" of the imaging layer from hydrophilic to oleophilic in the exposed areas upon exposure to energy that provides or generates heat, when the cationic moiety reacts with its counterion. The net result is the loss of charge. Such reactions are more easily accomplished when the anion of the organoonium moiety is more nucleophilic and/or more basic, as described above for the Class I polymers.

The organoonium moiety within the polymer can be chosen from a trisubstituted sulfur moiety (organosulfonium), a tetrasubstituted nitrogen moiety (organoammonium), or a tetrasubstituted phosphorous moiety (organophosphonium). The tetrasubstituted nitrogen (organoammonium) moieties are preferred. This moiety can be chemically attached to (that is, pendant) the polymer backbone, or incorporated within the backbone in some fashion, along with the suitable counterion. In either embodiment, the organoonium moiety is present in sufficient repeating units of the polymer (at least 20 mol %) so that the heat-activated reaction described above can occur to provide desired hydrophobicity of the imaging layer. When chemically attached as a pendant group, the organoonium moiety can be attached along a principal backbone of the polymer, or to one or more branches of a polymeric network, or both. When chemically incorporated within the polymer backbone, the moiety can be present in either cyclic or acyclic form, and can also form a branching point in a polymer network. Preferably, the organoonium moiety is provided as a pendant group along the polymeric backbone. Pendant organoonium moieties can be chemically attached to the polymer backbone after polymer formation, or functional groups on the polymer can be converted to organoonium moieties using known chemistry. For example, pendant quaternary ammonium groups can be provided on a polymeric backbone by the displacement of a "leaving group" functionality (such as a halogen) by a tertiary amine nucleophile. Alternatively, the organoonium group can be present on a monomer that is then polymerized or derived by the alkylation of a neutral heteroatom unit (trivalent nitrogen or phosphorous group or divalent sulfur group) already incorporated within the polymer.

The organoonium moiety is substituted to provide a positive charge. Each substituent must have at least one carbon atom that is directly attached to the sulfur, nitrogen or phosphorus atom of the organoonium moiety. Useful substituents include, but are not limited to, substituted or unsubstituted alkyl groups having 1 to 12 carbon atoms and preferably from 1 to 7 carbon atoms (such as methyl, ethyl, n-propyl, isopropyl, t-butyl, hexyl, methoxyethyl, isopropoxymethyl, substituted or unsubstituted aryl groups (phenyl, naphthyl, p-methylphenyl, m-methoxyphenyl, p-chlorophenyl, p-methylthiophenyl, p-N,N-dimethylaminophenyl, xylyl, methoxycarbonylphenyl and cyanophenyl), and substituted or unsubstituted cycloalkyl groups having 5 to 8 carbon atoms in the carbocyclic ring (such as cyclopentyl, cyclohexyl, 4-methylcyclohexyl and 3-methylcyclohexyl). Other useful substituents would be readily apparent to one skilled in the art, and any combination of the expressly described substituents is also contemplated.

The organoonium moieties include any suitable anion as described above for the Class I polymers. The halides and carboxylates are preferred.

Representative Class II non-vinyl polymers are identified herein below as Polymers 7–8 and 10. Mixtures of these polymers can also be used. Polymer 9 is a precursor to Polymer 10.

In addition, vinyl Class II polymers can be used in the practice of this invention. Like the non-vinyl polymers, such heat-sensitive polymers are composed of recurring units having one or more types of organoonium group. For example, such a polymer can have recurring units with both organoammonium groups and organosulfonium groups. It is also not necessary that all of the organoonium groups have the same alkyl substituents. For example, a polymer can have recurring units having more than one type of organoammonium group. Useful anions in these polymers are the same as those described above for the non-vinyl polymers. In addition, the halides and carboxylates are preferred.

The organoonium group is present in sufficient recurring units of the polymer so that the heat-activated reaction described above can occur to provide desired hydrophobicity of the imaged printing layer. The group can be attached along a principal backbone of the polymer, or to one or more branches of a polymeric network, or both. Pendant groups can be chemically attached to the polymer backbone after polymer formation using known chemistry. For example, pendant organoammonium, organophosphonium or organosulfonium groups can be provided on a polymeric backbone by the nucleophilic displacement of a pendant leaving group (such as a halide or sulfonate ester) on the polymeric chain by a trivalent amine, divalent sulfur or trivalent phosphorous nucleophile. Pendant onium groups can also be provided by alkylation of corresponding pendant neutral heteroatom groups (nitrogen, sulfur or phosphorous) using any commonly used alkylating agent such as alkyl sulfonate esters or alkyl halides. Alternatively a monomer precursor containing the desired organoammonium, organophosphonium or organosulfonium group may be polymerized to yield the desired polymer.

The organoammonium, organophosphonium or organosulfonium group in the vinyl polymer provides the desired positive charge. Generally, preferred pendant organoonium groups can be illustrated by the following Structures III, IV and V:

III

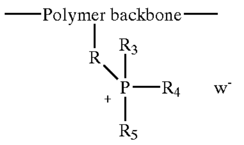

IV

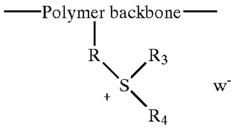

V

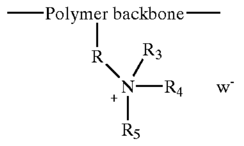

wherein R is a substituted or unsubstituted alkylene group having 1 to 12 carbon atoms that can also include one or more oxy, thio, carbonyl, amido or alkoxycarbonyl groups with the chain (such as methylene, ethylene, isopropylene, methylenephenylene, methyleneoxymethylene, n-butylene and hexylene), a substituted or unsubstituted arylene group having 6 to 10 carbon atoms in the ring (such as phenylene, naphthylene, xylylene and 3-methoxyphenylene), or a substituted or unsubstituted cycloalkylene group having 5 to 10 carbon atoms in the ring (such as 1,4-cyclohexylene, and 3-methyl-1,4-cyclohexylene). In addition, R can be a combination of two or more of the defined substituted or unsubstituted alkylene, arylene and cycloalkylene groups. Preferably, R is a substituted or unsubstituted ethyleneoxycarbonyl or phenylenemethylene group. Other useful substituents not listed herein could include combinations of any of those groups listed above as would be readily apparent to one skilled in the art.

$R_3$, $R_4$ and $R_5$ are independently substituted or unsubstituted alkyl group having 1 to 12 carbon atoms (such as methyl, ethyl, n-propyl, isopropyl, t-butyl, hexyl, hydroxymethyl, methoxymethyl, benzyl, methylenecarboalkoxy and a cyanoalkyl), a substituted or unsubstituted aryl group having 6 to 10 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl and cyanophenyl), or a substituted or unsubstituted cycloalkyl group having 5 to 10 carbon atoms in the carbocyclic ring (such as 1,3- or 1,4-cyclohexyl). Alternatively, any two of $R_3$, $R_4$ and $R_5$ can be combined to form a substituted or unsubstituted heterocyclic ring with the charged phosphorus, sulfur or nitrogen atom, the ring having 4 to 8 carbon, nitrogen, phosphorus, sulfur or oxygen atoms in the ring. Such heterocyclic rings include, but are not limited to, substituted or unsubstituted morpholinium, piperidinium and pyrrolidinium groups for Structure V. Other useful substituents for these various groups would be readily apparent to one skilled in the art, and any combinations of the expressly described substituents are also contemplated.

Preferably, $R_3$, $R_4$ and $R_5$ are independently substituted or unsubstituted methyl or ethyl groups.

$W^-$ is any suitable anion as described above for the Class I polymers. Acetate and chloride are preferred anions.

Polymers containing quaternary ammonium groups as described herein are most preferred vinyl Class II polymers.

In preferred embodiments, the vinyl Class II polymers useful in the practice of this invention can be represented by the following Structure VI:

VI

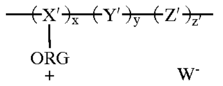

wherein X' represents recurring units to which the organoonium groups ("ORG") are attached, Y' represents recurring units derived from ethylenically unsaturated polymerizable monomers that may provide active sites for crosslinking using any of various crosslinking mechanisms (described below), and Z' represents recurring units derived from any additional ethylenically unsaturated polymerizable monomers. The various recurring units are present in suitable amounts, as represented by x' being from about 20 to about 99 mol %, y' being from about 1 to about 20 mol %, and z' being from 0 to about 79 mol %. Preferably, x' is from about 30 to about 98 mol %, y' is from about 2 to about 10 mol % and z' is from 0 to about 68 mol %.

Crosslinking of the vinyl polymer can be achieved in the same way as described above for the Class I polymers.

Additional monomers that provide the additional recurring units represented by Z' in Structure VI include any useful hydrophilic or oleophilic ethylenically unsaturated polymerizable monomer that may provide desired physical or printing properties to the imaging layer. Such monomers include, but are not limited to, acrylates, methacrylates, acrylonitrile, isoprene, styrene and styrene derivatives, acrylamides, methacrylamides, acrylic or methacrylic acid and vinyl halides.

Representative vinyl polymers of Class II include Polymers 11–20 as identified herein below, and Polymer 14 is most preferred. A mixture of any two or more of these polymers can also by used.

The imaging layer of the imaging member can include one or more Class I or II polymers with or without minor amounts (less than 20 weight %, based on total dry weight of the layer) of additional binder or polymeric materials that will not adversely affect its imaging properties.

In the composition used to provide the heat-sensitive layer, the amount of charged polymer is generally present in an amount of at least 1% solids, and preferably at least 2% solids. A practical upper limit of the amount of charged polymer in the composition is about 10% solids.

The amount of charged polymer(s) used in the imaging layer is generally at least 0.1 g/m$^2$, and preferably from about 0.1 to about 10 g/m$^2$ (dry weight). This generally provides an average dry thickness of from about 0.1 to about 10 $\mu$m.

The imaging layer can also include one or more conventional surfactants for coatability or other properties, dyes or colorants to allow visualization of the written image, or any other addenda commonly used in the lithographic art, as long as the concentrations are low enough so they are inert with respect to imaging or printing properties.

It is essential that the heat-sensitive imaging layer includes one or more photothermal conversion materials to absorb appropriate radiation from an appropriate energy source (such as a laser), which radiation is converted into heat. Thus, such materials convert photons into heat. Preferably, the radiation absorbed is in the infrared and near-infrared regions of the electromagnetic spectrum. The photothermal conversion materials useful in this invention are multisulfonated IR dyes that comprise one or more aromatic carbocyclic or heterocyclic groups within the molecules. There are at least three sulfo groups (or sulfonate substituents) anywhere in the molecule. Preferably, at least two of the sulfo groups are attached directly or indirectly to one or more of the aromatic carbocyclic or heterocyclic groups.

It is also essential that the IR dye be soluble in water or any of the water-miscible organic solvents that are described below as useful for preparing coating compositions. Preferably, the IR dyes are soluble in either water or methanol, or a mixture of water and methanol. Solubility in water or the water-miscible organic solvents means that the IR dye can be dissolved at a concentration of at least 0.5 g/l at room temperature.

The IR dyes are sensitive to radiation in the near-infrared and infrared regions of the electromagnetic spectrum. Thus, they are generally sensitive to radiation at or above 700 nm (preferably from about 800 to about 900 nm, and more preferably from about 800 to about 850 nm).

The sulfonated IR dyes useful in this invention can be generally cyanine dyes having two nitrogen atoms conjugated to a polymethine chain that is terminated with 2 cyclic groups. One or more aromatic carbocyclic or aromatic or nonaromatic heterocyclic groups are also conjugated with the polymethine chain, that is either as part of the polymethine chain, or at either or both ends of the polymethine chain. Various aromatic carbocyclic and aromatic or non-aromatic heterocyclic groups are defined in more detail below as well as possible polymethine chains.

Particularly useful IR dyes useful in the practice of this invention include, but are not limited to, the compounds represented by Structure DYE-1 shown as follows:

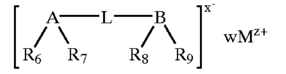

wherein "A" and "B" are independently substituted or unsubstituted cyclic groups that are either completely aromatic in nature, or that include an aromatic moiety fused to a non-aromatic heterocyclic or carbocyclic ring.

Useful aromatic carbocyclic groups generally include 6 to 10 carbon atoms in the ring including but not limited to, phenyl, naphthyl and tolyl groups (that can be substituted for example with halo, alkyl, alkoxy, aryl, sulfo, carboxy, acetyl or hydroxy groups). Useful heterocyclic groups generally include 6 to 10 of any chemically possible combination of carbon, nitrogen, oxygen, sulfur and selenium atoms. Examples of such heterocyclic groups include, but are not limited to, substituted or unsubstituted pyridyl, pyrimidyl, quinolinyl, phenathridyl, indolyl, benzindolyl and naphthindolyl groups (that can be substituted for example with halo, sulfo, carboxy, hydroxy, hydroxyalkyl, alkyl or aryl groups).

Preferably, the useful aromatic carbocyclic groups are substituted or unsubstituted phenyl or naphthyl groups, and the useful heterocyclic groups are substituted or unsubstituted indolyl, benzindolyl or naphthindolyl groups. More preferably A and B are independently substituted or unsubstituted indolyl or benzindolyl groups.

In Structure DYE-1 shown above, "L" is a substituted or unsubstituted chromophoric chain conjugated to both A and B to provide sensitivity to near infrared or infrared radiation as described above (that is at least 700 nm). In one embodiment, L includes a nitrogen atom at one or both ends when A or B (or both) are carbocyclic groups. In another embodiment, A and B are N-heterocyclic groups and L is connected to nitrogen atoms in those groups. Additionally, L comprises a chain of at least 3 carbon atoms having alternating single and double bonds to provide conjugation with the A and B groups (with or without nitrogen atoms). Preferably, L comprises at least 5 carbon atoms, and more preferably, L comprises from 7 to 9 carbon atoms. Any hydrogen atom in the conjugated chain can be replaced with any desirable substituent, or any two adjacent carbon atoms can be part of a cyclic moiety, as long as the conjugation and IR sensitivity of the molecule are not adversely affected.

$R_6$, $R_7$, $R_8$ and $R_9$ are the same or different substituents that include, but are not limited to, sulfo, substituted or unsubstituted alkyl groups (having 1 to 10 carbon atoms, branched or linear), substituted or unsubstituted alkoxy groups (having 1 to 10 carbon atoms), halo groups, carboxy, substituted or unsubstituted aryl groups (having 6 to 10 carbon atoms in the ring) and any other substituents that would be readily apparent to a skilled worker in the art. Preferably at least two of these groups are sulfo groups.

As used herein, the term "sulfo" is meant to include an inorganic sulfonate group ($—SO_3^{-1}$) group as well as oxysulfonate ($—OSO_3^{-1}$), thiosulfonate ($—SSO_3^{-1}$), substituted or unsubstituted sulfoaryl groups (that is sulfo connected to the A, B or L through an arylene group) having from 6 to 10 carbon atoms in the aromatic ring, substituted or unsubstituted sulfoalkyl groups (that is sulfo connected to A, B or L through branched or linear alkylene groups) having 1 to 14 carbon atoms, substituted or unsubstituted sulfoalkyl groups (that is sulfo connected to A, B or L through branched or linear alkenylene groups), sulfoalkynyl groups (that is sulfo connected to A, B or L through branched or linear alkynylene groups), or substituted or unsubstituted sulfoaralkyl or sulfoalkaryl groups (sulfo connected to A, B or L through arylenealkylene or alkylene-arylene groups) having 7 to 20 carbon atoms in the chain. One skilled in the art would readily understand the nature and composition of such groups that link the sulfo group to the A, B or L group. Such linking groups can also be substituted with additional substituents that would be readily apparent to one skilled in the art. In addition, Structure DYE-1 can also have additional sulfo groups beyond those represented by $R_7$–$R_{10}$. Such additional groups can be located anywhere in the molecule as long as the compound retains the desired IR sensitivity.

In Structure DYE-1, M is a suitable cation of appropriate charge to balance the negatively charged portion of the IR dye. Useful cations include, but are not limited to, hydrogen, ammonium, sulfonium, phosphonium and metal ions (such as alkali or alkaline earth ions). Where there are multiple "M" ions, they can be the same or different. Thus, "w" and "z" are integers that provide the desired charge to balance "$x^-$" that represents the overall charge of the dye anion.

Useful IR dyes can be more specifically represented by Structure DYE-2 as follows:

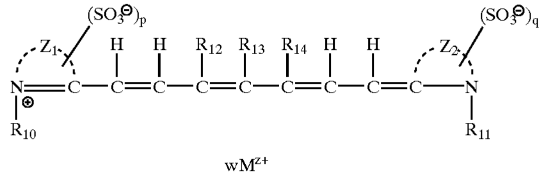

wherein $R_{10}$ and $R_{11}$ are independently sulfo (as defined above). Preferably, $R_{10}$ and $R_{11}$ are independently sulfoalkyl having 1 to 4 carbon atoms (such as sulfomethyl, sulfoethyl, sulfoisopropyl, sulfo-n-propyl and sulfoisobutyl groups), sulfoaryl groups as defined above (such as sulfophenyl), sulfoalkenyl groups as defined above (such as sulfoethenyl), sulfoalkynyl groups as defined above (such as sulfoethynyl), or oxysulfonate groups.

$R_{12}$ and $R_{14}$ are independently hydrogen, substituted alkyl groups having 1 to 10 carbon atoms (such as methyl, ethyl, isopropyl, t-butyl, benzyl and hexyl), substituted or unsubstituted aryl groups (having 6 to 10 carbon atoms) or together represent the carbon atoms necessary to complete a substituted or unsubstituted 5- or 6-membered carbocyclic ring (such as cyclopentyl, cyclohexenyl, 5-hydroxycyclohexenyl or 5,5'-dimethylcyclohexenyl). $R_{13}$ is hydrogen, a substituted or unsubstituted alkyl group having 1 to 10 carbon atoms, a substituted or unsubstituted aryl group of 6 to 10 carbon atoms in the aryl ring, halo, a substituted or unsubstituted thioalkyl group having 1 to 10 carbon atoms, a substituted or unsubstituted thioaryl group having 6 to 10 carbon atoms in the aryl ring, cyano, or amino (primary, secondary or tertiary with alkyl or aryl groups as defined above), or a substituted or unsubstituted heterocyclic ring having 5 to 10 carbon, nitrogen, sulfur and oxygen atoms.

In Structure DYE-2, p and q are independently 0 or integers of 1 to 3, and when p or q is 2 or 3, $R_{10}$ and $R_{11}$ can be the same or different group. There are at least 3 sulfo groups in the Structure DYE-2 molecule.

$Z_1$ and $Z_2$ independently represent the atoms needed to complete a substituted or unsubstituted indolyl, benzindolyl or naphthindolyl group. These groups can be further substituted beyond $R_{10}$ and $R_{11}$ with groups described above for $R_{6-9}$.

M, w, z are as defined above for Structure DYE-1, so that w and z are integers to balance the overall charge of the dye anion.

Examples of such useful aromatic IR dyes include, but are not limited to, the following compounds which comprises on organic moiety comprising an infrared sensitive group and at least three sulfo groups covalently bound to the organic moiety:

IR Dye 1

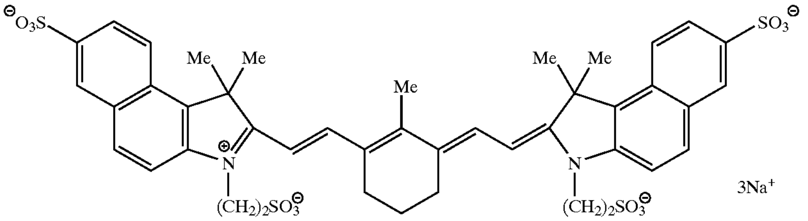

IR Dye 2

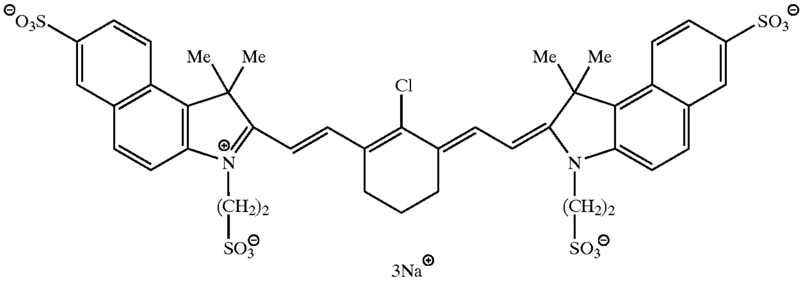

IR Dye 3

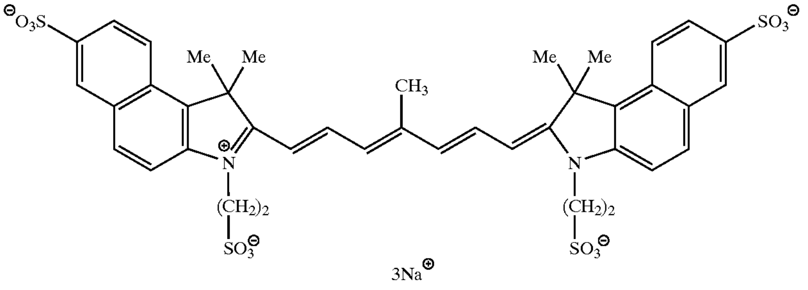

IR Dye 4

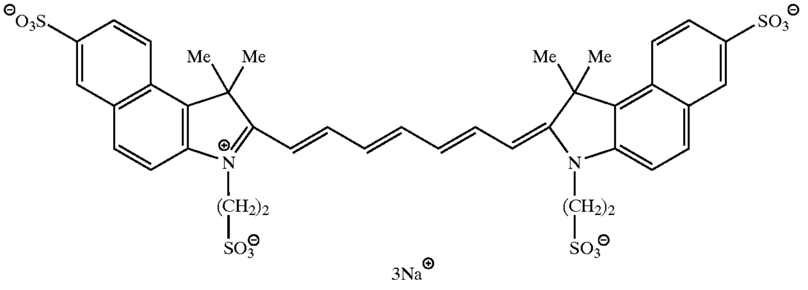

-continued

IR Dye 5

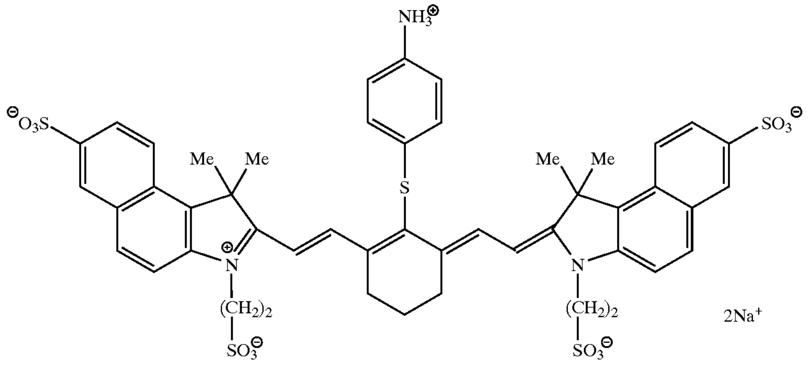

IR Dye 6

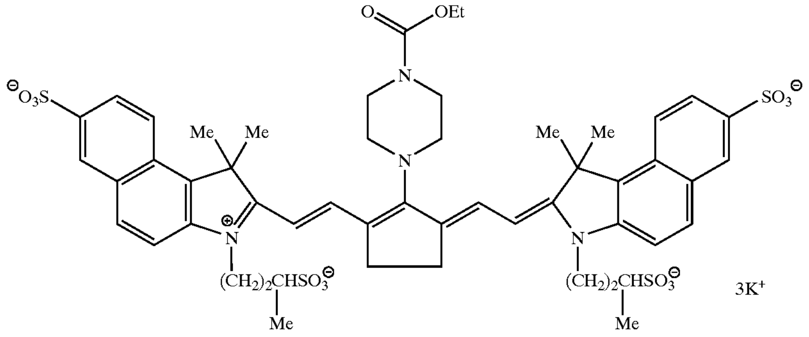

IR Dye 7

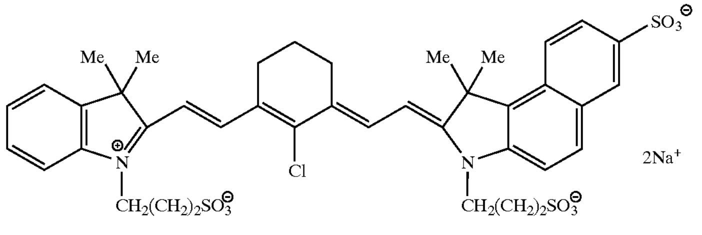

The IR dyes useful in the practice of this invention can be prepared using known procedures, as described for example in U.S. Pat. No. 4,871,656 (Parton et al) and reference noted therein (for example, U.S. Pat. No. 2,895,955, 3,148,187 and 3,423,207), all incorporated by reference. Representative synthetic methods for making some of the preferred IR dyes are provided below.

The heat-sensitive compositions and imaging layers can include additional photothermal conversion materials, although the presence of such materials is not preferred. Such optional materials can be other IR dyes, carbon black, polymer grafted carbon, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. Useful absorbing dyes for near infrared diode laser beams are described, for example, in U.S. Pat. No. 4,973,572 (DeBoer). Particular dyes of interest are "broad band" dyes, that is those that absorb over a wide band of the spectrum.

Alternatively, the same or different photothermal conversion material (including an aromatic IR dye described herein) can be included in a separate layer that is in thermal contact with the heat-sensitive imaging layer. Thus, during imaging, the action of the additional photothermal conversion material can be transferred to the heat-sensitive imaging layer.

The heat-sensitive composition of this invention can be applied to a support using any suitable equipment and procedure, such as spin coating, knife coating, gravure coating, dip coating or extrusion hopper coating. In addition, the composition can be sprayed onto a support, including a cylindrical support, using any suitable spraying means for example as described in U.S. Pat. No. 5,713,287 (noted above).

The heat-sensitive compositions of this invention are generally formulated in and coated from water or water-miscible organic solvents including, but not limited to, water-miscible alcohols (for example, methanol, ethanol, isopropanol, 1-methoxy-2-propanol and n-propanol), methyl ethyl ketone, tetrahydrofuran, acetonitrile and acetone. Water, methanol, ethanol and 1-methoxy-2-propanol are preferred. Mixtures (such as a mixture of water and methanol) of these solvents can also be used if desired. By "water-miscible" is meant that the organic solvent is miscible in water at all proportions at room temperature.

The imaging members of this invention can be of any useful form including, but not limited to, printing plates, printing cylinders, printing sleeves and printing tapes (including flexible printing webs), all of any suitable size or dimensions. Preferably, the imaging members are printing plates or on-press cylinders.

During use, the imaging member of this invention is exposed to a suitable source of energy that generates or provides heat, such as a focused laser beam or a thermoresistive head, in the foreground areas where ink is desired in the printed image, typically from digital information supplied to the imaging device. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al), incorporated herein by reference. The imaging member is typically sensitized so as to maximize responsiveness at the emitting wavelength of the laser.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between an imaging device (such as laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the beam can be moved parallel to the drum axis and, after each pass across the imaging member, increment angularly so that the image "grows" circumferentially. In both cases, after a complete scan by the laser beam, an image corresponding to the original document or picture can be applied to the surface of the imaging member.

In the flatbed configuration, a laser beam is drawn across either axis of the imaging member, and is indexed along the other axis after each pass. Obviously, the requisite relative motion can be produced by moving the imaging member rather than the laser beam.

While laser imaging is preferred in the practice of this invention, imaging can be provided by any other means that provides or generates thermal energy in an imagewise fashion. For example, imaging can be accomplished using a thermoresistive head (thermal printing head) in what is known as "thermal printing", described for example in U.S. Pat. No. 5,488,025 (Martin et al). Such thermal printing heads are commercially available (for example, as Fujisu Thermal Head FTP-040 MCS001 and TDK Thermal Head F415 HH7-1089).

Imaging of heat-sensitive compositions on printing press cylinders can be accomplished using any suitable means, for example, as taught in U.S. Pat. No. 5,713,287 (noted above), that is incorporated herein by reference.

After imaging, the imaging member can be used for printing without conventional wet processing. Applied ink can be imagewise transferred to a suitable receiving material (such as cloth, paper, metal, glass or plastic) to provide one or more desired impressions. If desired, an intermediate blanket roller can be used to transfer the ink from the imaging member to the receiving material. The imaging members can be cleaned between impressions, if desired, using conventional cleaning means.

The following examples illustrate the practice of the invention, and are not meant to limit it in any way. The synthetic methods are presented to show how some of the preferred heat-sensitive polymers and aromatic IR dyes can be prepared.

Polymers 1, 3–6 are illustrative of Class I polymers (Polymer 2 is a precursor to Polymer 3), Polymers 7–8 and 10 are illustrative of Class II non-vinyl polymers (Polymer 9 is a precursor to Polymer 10), and Polymers 11–20 are illustrative of Class II vinyl polymers.

Synthetic Methods

Preparation of Polymer 1: Poly (1-vinyl-3-methylimidazolium chloride-co-N-(3-aminopropyl) methacrylamide hydrochloride)

A] Preparation of 1-Vinyl-3-methylimidazolium methanesulfonate monomer

Freshly distilled 1-vinylimidazole (20.00 g, 0.21 mol) was combined with methyl methanesulfonate (18.9 ml, 0.22 mol) and 3-t-butyl-4-hydroxy-5-methylphenyl sulfide (about 1 mg) in diethyl ether (100 ml) in a round bottomed flask equipped with a reflux condenser and a nitrogen inlet and stirred at room temperature for 48 hours. The resulting precipitate was filtered off, thoroughly washed with diethyl ether, and dried overnight under vacuum at room temperature to afford 37.2 g of product as a white, crystalline powder (86.7% yield).

B] Copolymerization/ion Exchange

1-Vinyl-3-methylimidazolium methanesulfonate (5.00 g, $2.45\times10^{-2}$ mol), N-(3-aminopropyl) methacrylamide hydrochloride (0.23 g, $1.29\times10^{-3}$ mol) and 2,2'-azobisisobutyronitrile (AIBN) (0.052 g, $3.17\times10^{-4}$ mol) were dissolved in methanol (60 ml) in a 250 ml round bottomed flask equipped with a rubber septum. The solution was bubble degassed with nitrogen for ten minutes and heated at 60° C. in a water bath for 14 hours. The viscous solution was precipitated into 3.5 liters of tetrahydrofuran and dried under vacuum overnight at 50° C. to give 4.13 g of product (79.0% yield). The polymer was then dissolved in 100 ml methanol and converted to the chloride by passage through a flash column containing 400 $cm^3$ DOWEX® 1X8-100 ion exchange resin.

Preparation of Polymer 2: Poly(methyl methacrylate-co-4-vinylpyridine)(9:1 molar ratio)

Methyl methacrylate (30 ml), 4-vinylpyridine (4 ml), AIBN (0.32 g, $1.95\times10^{-3}$ mol), and N,N-dimethylformamide (40 ml, DMF) were combined in a 250 ml round bottomed flask and fitted with a rubber septum. The solution was purged with nitrogen for 30 minutes and heated for 15 hours at 60° C. Methylene chloride and DMF (150 ml of each) were added to dissolve the viscous product and the product solution was precipitated twice into isopropyl ether. The precipitated polymer was filtered and dried overnight under vacuum at 60° C.

Preparation of Polymer 3: Poly(methyl methacrylate-co-N-methyl-4-vinylpyridinium formate) (9:1 molar ratio)

Polymer 2 (10 g) was dissolved in methylene chloride (50 ml) and reacted with methyl p-toluenesulfonate (1 ml) at reflux for 15 hours. NMR analysis of the reaction showed that only partial N-alkylation had occurred. The partially reacted product was precipitated into hexane, then dissolved in neat methyl methanesulfonate (25 ml) and heated at 70° C. for 20 hours. The product was precipitated once into diethyl ether and once into isopropyl ether from methanol and dried under vacuum overnight 60° C. A flash chromatography column was loaded with 300 $cm^3$ of DOWEX® 550 hydroxide ion exchange resin in water eluent. This resin was converted to the formate by running a liter of 10% formic acid through the column. The column and resin were thoroughly washed with methanol, and the product polymer (2.5 g) was dissolved in methanol and passed through the column. Complete conversion to the formate counterion was confirmed by ion chromatography.

Preparation of Polymer 4: Poly(methyl methacrylate-co-N-butyl-4-vinylpyridinium formate) (9:1 molar ratio)

Polymer 2 (5 g) was heated at 60° C., for 15 hours in 1-bromobutane (200 ml). The precipitate that formed was dissolved in methanol, precipitated into diethyl ether, and dried for 15 hours under vacuum at 60° C. The polymer was converted from the bromide to the formate using the method described in the preparation of Polymer 3.

Preparation of Polymer 5: Poly(methyl methacrylate-co-2-vinyliyridine) (9:1 molar ratio)

Methyl methacrylate (18 ml), 2-vinylpyridine (2 ml), AIBN (0.16 g,), and DMF (30 ml) were combined in a 250 ml round bottomed flask and fitted with a rubber septum. The solution was purged with nitrogen for 30 minutes and heated for 15 hours at 60° C. Methylene chloride (50 ml) was added to dissolve the viscous product and the product solution was precipitated twice into isopropyl ether. The precipitated polymer was filtered and dried overnight under vacuum at 60° C.

Preparation of Polymer 6: Poly(methyl methacrylate-co-N-methyL-2-vinylpyridinium formate) (9:1 molar ratio)

Polymer 5 (10 g) was dissolved in 1,2-dichloroethane (100 ml) and reacted with methyl p-toluenesulfonate (15 ml) at 70° C. for 15 hours. The product was precipitated twice into diethyl ether and dried under vacuum overnight at 60° C. A sample (2.5 g) of this polymer was converted from the p-toluene-sulfonate to the formate using the procedure described above for Polymer 3.

Preparation of Polymer 7: Poly(p-xylidenetetrahydro-thiophenium chloride)

Xylylene-bis-tetrahydrothiophenium chloride (5.42 g, 0.015 mol) was dissolved in 75 ml of deionized water and filtered through a fritted glass funnel to remove a small amount of insolubles. The solution was placed in a three-neck round-bottomed flask on an ice bath and was sparged with nitrogen for fifteen minutes. A solution of sodium hydroxide (0.68 g, 0.017 mol) was added dropwise over fifteen minutes via addition funnel. When about 95% of the hydroxide solution was added, the reaction solution became very viscous and the addition was stopped. The reaction was brought to pH 4 with 10% HCl and purified by dialysis for 48 hours.

Preparation of Polymer 8: Poly[phenylene sulfide-co-methyl(4-thiophenyl)sulfonium chloride]

Poly (phenylene sulfide) (15.0 g, 0.14 mol-repeating units), methanesulfonic acid (75 ml), and methyl triflate (50.0 g, 0.3 mol) were combined in a 500 ml round bottomed flask equipped with a heating mantle, reflux condenser, and nitrogen inlet. The reaction mixture was heated to 90° C. at which point a homogeneous, brown solution resulted, and was allowed to stir at room temperature overnight. The reaction mixture was poured into 500 $cm^3$ of ice and brought to neutrality with sodium bicarbonate. The resultant liquid/solid mixture was diluted to a final volume of 2 liters with water and dialyzed for 48 hours at which point most of the solids had dissolved. The remaining solids were removed by filtration and the remaining liquids were slowly concentrated to a final volume of 700 ml under a stream of nitrogen. The polymer was ion exchanged from the triflate to the chloride by passing it through a column of DOWEX® 1x8-100 resin. Analysis by $^1$H NMR showed that methylation of about 45% of the sulfur groups had occurred.

Preparation of Polymer 9: Brominated poly(2,6-dimethyl-1,4-phenylene oxide)

Poly (2,6-dimethyl-1,4-phenylene oxide) (40 g, 0.33 mol repeating units) was placed dissolved in carbon tetrachloride (2400 ml) in a 5 liter round bottomed 3-neck flask with a reflux condenser and a mechanical stirrer. The solution was heated to reflux and a 150 Watt flood lamp was applied. N-bromosuccinimide (88.10 g, 0.50 g) was added portion-wise over 3.5 hours, and the reaction was allowed to stir at reflux for an additional hour. The reaction was cooled to room temperature to yield an orange solution over a brown solid. The liquid was decanted and the solids were stirred with 100 ml methylene chloride to leave a white powder (succinimide) behind. The liquid phases were combined, concentrated to 500 ml via rotary evaporation, and precipitated into methanol to yield a yellow powder. The crude product was precipitated twice more into methanol and dried overnight under vacuum at 60° C. Elemental and $^1$H NMR analyses showed a net 70% bromination of benzyl side chains.

Preparation of Polymer 10: Dimethyl sulfonium bromide derivative of poly(2,6-dimethyl-1,4-phenylene oxide)

Brominated poly(2,6-dimethyl-1,4-phenylene oxide) described above (2.00 g, 0.012 mol benzyl bromide units) was dissolved in methylene chloride (20 ml) in a 3-neck round bottomed flask outfitted with a condenser, nitrogen inlet, and septum. Water (10 ml) was added along with dimethyl sulfide (injected via syringe) and the two-phase mixture was stirred at room temperature for one hour and then at reflux at which point the reaction turned into a thick dispersion. This was poured into 500 ml of tetrahydrofuran and agitated vigorously in a chemical blender. The product, which gelled after approximately an hour in the solid state, was recovered by filtration and quickly redissolved in 100 ml methanol and stored as a methanolic solution.

Preparation of Polymer 11: Poly[methyl methacrylate-co-2-trimethylammoniumethyl methacrylic chloride-co-N-(3-aminopropyl) methacrylamide hydrochloride](7:2:1 molar ratio)

Methyl methacrylate (24.6 ml, 0.23 mol), 2-trimethylammoniumethyl methacrylic chloride (17.0 g, 0.08 mol), n-(3-aminopropyl) methacrylamide hydrochloride (10.0 g, 0.56 mol), azobisisobutyronitrile (0.15 g, $9.10\times10^{-4}$ mol, AIBN), water (20 ml) and dimethylformamide (150 ml) were combined in a round bottom flask fitted with a rubber septum. The solution was bubble degassed with nitrogen for 15 minutes and placed in a heated water bath at 60° C. overnight. The viscous product solution was diluted with methanol (125 ml) and precipitated three times from methanol into isopropyl ether. The product was dried under vacuum at 60° C. for 24 hours and stored in a dessicator.

Preparation of Polymer 12: Poly[methyl methacrylate-co-2-trimethylammoniumethyl methacrylic acetate-co-N-(3-aminopropyl) methacrylamide](7:2:1 molar ratio)

Polymer 11 (3.0 g) was dissolved in 100 ml of methanol and neutralized by passing through a column containing 300 $cm^3$ of tertiary amine functionalized crosslinked polystyrene resin (Scientific Polymer Products # 726, 300 $cm^2$) with methanol eluent. That polymer was then converted to the acetate using a column of 300 $cm^3$ DOWEX® 1x8-100 ion exchange resin (that is, converted from the chloride to the acetate by washing with 500 ml glacial acetic acid) and methanol eluent.

Preparation of Polymer 13: Poly[methyl methacrylate-co-2-trimethylammoniumethyl methacrylic fluoride-co-N-(3-aminopropyl) methacrylamide hydrochloride] (7:2:1 molar ratio)

Polymer 11 (3.0 g) was dissolved in 100 ml of methanol and neutralized by passing through a column containing 300 $cm^3$ tertiary amine functionalized crosslinked polystyrene resin (Scientific Polymer Products # 726, 300 $cm^2$) with methanol eluent. The polymer was then converted to the fluoride using a column of 300 $cm^3$ DOWEX® 1x8-100 ion exchange resin (that is, converted from the chloride to the fluoride by washing with 500 g of potassium fluoride) and methanol eluent.

Preparation of Polymer 14: Poly[vinylbenzyl trimethylammonium chloride-co-N-(3-aminopropyl) methacrylamide hydrochloride] (19:1 molar ratio)

Vinylbenzyl trimethylammonium chloride (19 g, 0.0897 mol, 60:40 mixture of p,m isomers), N-(3-aminopropyl) methacrylamide hydrochloride (1 g, 0.00562 mol), 2,2'-azobis(2-methylpropionamidine) dihydrochloride (0.1 g), and deionized water (80 ml) were combined in a round bottom flask fitted with a rubber septum. The reaction mixture was bubble degassed with nitrogen for 15 minutes and placed in a water bath at 60° C. for four hours. The resulting viscous product solution was precipitated into acetone, dried under vacuum at 60° C. for 24 hours, and stored in a dessicator.

Preparation of Polymer 15: Poly ([vinylbenzyltrimethyl-phosphonium acetate-co-N-(3-aminopropyl) methacrylamide hydrochloride] (19:1 molar ratio)

A] Vinylbenzyl bromide (60:40 mixture of p,m isomers)

Vinylbenzyl chloride (50.60 g, 0.33 mol, 60:40 mixture of p,m isomers), sodium bromide (6.86 g, $6.67\times10^{-2}$ mol), N-methylpyrrolidone (300 ml, passed through a short column of basic alumina), ethyl bromide (260 g), and 3-t-butyl-4-hydroxy-5-methyl phenyl sulfide (1.00 g, $2.79\times10^{-3}$ mol) were combined in a 1 liter round bottomed flask fitted with a reflux condenser and a nitrogen inlet and the mixture was heated at reflux for 72 hours at which point the reaction was found to have proceeded to >95% conversion by gas chromatography. The reaction mixture was poured into 1 liter of water and extracted twice with 300 ml of diethyl ether. The combined ether layers were extracted twice with 1 liter of water, dried over $MgSO_4$, and the solvents were stripped by rotary evaporation to yield yellowish oil. The crude product was purified by vacuum distillation to afford 47.5 g of product (53.1% yield).

B] Vinylbenzyl trimethylphosphonium bromide

Trimethylphosphine (50.0 ml of a 1.0 molar solution in tetrahydrofuran, $5.00\times10^{-2}$ mol) was added via addition funnel over about 2 minutes into a thoroughly nitrogen degassed dispersion of vinylbenzyl bromide (9.85 g, $5.00\times10^{-2}$ mol) in diethyl ether (100 ml). A solid precipitate began to form almost immediately. The reaction was allowed to stir for 4 hours at room temperature, then was placed in a freezer overnight. The solid product was isolated by filtration, washed three times with 100 ml of diethyl ether, and dried under vacuum for 2 hours. Pure product (11.22 g) was recovered as a white powder (82.20% yield).

C] Poly [vinylbenzyltrimethylphosphonium bromide-co-N-(3-aminopropyl)methacrylamide] (19:1 molar ratio)

Vinylbenzyltrimethylphosphonium bromide (5.00 g, $1.83\times10^{-2}$ mol), N-(3-aminopropyl) methacrylamide hydrochloride (0.17 g, $9.57\times10^{-4}$ mol), azobisisobutyronitrile (0.01 g, $6.09\times10^{-5}$ mol), water (5.0 ml), and dimethylformamide (25 ml) were combined in a 100 ml round bottomed flask sealed with a rubber septum, bubble degassed for 10 minutes with nitrogen, and placed in a warm water bath (55° C.) overnight. The viscous solution was precipitated into tetrahydrofuran and dried under vacuum overnight at 60° C. The liquids were filtered off, concentrated on a rotary evaporator to a volume of about 200 ml, precipitated again into tetrahydrofuran, and dried under vacuum overnight at 60° C. About 4.20 g was recovered. (81.9% yield).

D] Poly [vinylbenzyltrimethylphosphonium acetate-co-N-(3-aminopropyl) methacrylamide hydrochloride] (19:1 molar ratio)

DOWEX® 550 a hydroxide anion exchange resin (about 300 $cm^3$) was poured into a flash column with 3:1 methanol/water eluent. About 1 liter of glacial acetic acid was passed through the column to convert it to the acetate, followed by about 3 liters of 3:1 methanol/water. 3.0 g of the product from step C in 200 ml of 3:1 methanol/water was passed through the acetate resin column and the solvents were stripped on a rotary evaporator. The resulting viscous oil was thoroughly dried under vacuum to afford 2.02 g of a glassy, yellowish material (Polymer 15, 67.9 % yield). Ion chromatography showed complete conversion to the acetate.

Preparation of Polymer 16: Poly [dimethyl-2-(methacryloyloxy) ethylsulfonium chloride-co-N-(3-aminopropyl) methacreylamide hydrochloride] (19:1 molar ratio)

A] Dimethyl-2-(methacryloyloxy) ethylsulfonium methylsulfate 2-(Methylthio) ethylmethacrylate (30.00 g, 0.19 mol), dimethyl sulfate (22.70 g, 0.18 mol), and benzene (150 ml) were combined in a 250 ml round bottomed flask outfitted with a reflux condenser and a nitrogen inlet. The reaction solution was heated at reflux for 1.5 hours and allowed to stir at room temperature for 20 hours at which point the reaction had proceeded to about 95% yield by $^1H$ NMR. The solvent was removed by rotary evaporation to afford brownish oil that was stored as a 20 weight % solution in dimethylformamide and used without further purification.

B] Poly [dimethyl-2-(methacryloyloxy) ethylsulfonium methylsulfate-co-N-(3-aminopropyl) methacrylamide hydrochloride] (19:1 molar ratio)

Dimethyl-2-(methacryloyloxy) ethylsulfonium methylsulfate (93.00 g of 20 wt. % solution in dimethylfornamide, $6.40\times10^{-2}$ mol), N-(3-aminopropyl) methacrylamide hydrochloride (0.60 g, $3.36\times10^{-3}$ mol), and azobisisobutyronitrile (0.08 g, $4.87\times10^{-4}$ mol) were dissolved in methanol (100 ml) in a 250 ml round bottomed flask fitted with a septum. The solution was bubble degassed with nitrogen for 10 minutes and heated for 20 hours in a warm water bath at 55° C. The reaction was precipitated into ethyl acetate, redissolved in me thanol, precipitated a second time into ethyl acetate, and dried under vacuum overnight. A white powder (15.0 g) was recovered (78.12% yield).

C] Poly [dimethyl-2-(methacryloyloxy) ethylsulfonium chloride-co-N-(3-aminopropyl) methacrylamide hydrochloride] (19:1 molar ratio)

The precursor polymer (2.13 g) from step B was dissolved in 100 ml of 4:1 methanol/water and passed through a flash column containing 300 $cm^3$ of DOWEX® 1x8-100 anion exchange resin using 4:1 methanol/water eluent. The recovered solvents were concentrated to about 30 ml and precipitated into 300 ml of methyl ethyl ketone. The damp, white powder collected was redissolved in 15 ml of water and stored in a refrigerator as a solution of Polymer 16 (10.60% solids).

Preparation of Polymer 17: Poly [vinylbenzyldimethylsulfonium methylsulfate]

A] Methyl (vinylbenzyl) sulfide

Sodium methanethiolate (24.67 g, 0.35 mol) was combined with methanol (250 ml) in a 1 liter round bottomed flask outfitted with an addition funnel and a nitrogen inlet. Vinylbenzyl chloride (41.0 ml, 60:40 mixture of p- and o-isomers, 0.29 mol) in tetrahydrofuran (100 ml) was added via addition funnel over 30 minutes. The reaction mixture grew slightly warm and a milky suspension resulted. This was allowed to stir at room temperature for 20 hours at which point only a small amount of vinylbenzyl chloride was still evident by thin layer chromatography (2:1 hexanes/$CH_2Cl_2$ eluent). Another portion of sodium methanethiolate was added (5.25 g, $7.49\times10^{-2}$ mol) and after ten minutes, the reaction had proceeded to completion by thin layer chromatography. Diethyl ether (400 ml) was added and the resulting mixture was extracted twice with 600 ml of water and once with 600 ml of brine. The resulting organic extracts were dried over magnesium sulfate, a small amount (about 1 mg) of 3-t-butyl-4-hydroxy-5-methyl phenyl sulfide was added, and the solvents were stripped by rotary evaporation to afford a yellowish oil. Purification by vacuum distillation through a long Vigreux column yielded 43.35 g (91%) of the pure product as a clear liquid.

B] Dimethyl (vinylbenzyl) sulfonium methylsulfate

Methyl (vinylbenzyl) sulfide (13.59 g, $8.25\times10^{-2}$ mol), benzene (45 ml), and dimethyl sulfate (8.9 ml, $9.4\times10^{-2}$ mol) were combined in a 100 ml round bottomed flask equipped with a nitrogen inlet. The mixture was allowed to stir at room temperature for 44 hours, at which point two layers were present. Water (20 ml) was added and the top (benzene) layer was removed by pipette. The aqueous layer was extracted three times with 30 ml of diethyl ether and a vigorous stream of nitrogen was bubbled through the solution to remove residual volatile compounds. The product was used without further purification as a 35% (w/w) solution.

C] Poly [dimethyl (vinylbenzyl) sulfonium methylsulfate]

All of the dimethyl (vinylbenzyl) sulfonium methylsulfate solution from the previous step (approximately $5.7\times10^{-2}$ mol) was combined with water (44 ml) and sodium persulfate (0.16 g, $6.72\times10^{-4}$ mol) in a 200 ml round bottomed flask fitted with a rubber septum. The reaction solution was bubble degassed with nitrogen for ten minutes and heated for 24 hours in a water bath at 50° C. As the solution did not appear viscous, additional sodium persulfate (0.16 g, $6.72\times10^{-4}$ mol) was added and the reaction was allowed to proceed for 18 more hours at 50° C. The solution was then precipitated into acetone and immediately redissolved in water to give 100 ml of a solution of Polymer 17 (11.9% solids).

Preparation of Polymer 18: Poly [vinylbenzyldimethylsulfonium chloride]

The aqueous product solution of Polymer 17 (16 ml, ~4.0 g solids) was precipitated into a solution of benzyltrimethylammonium chloride (56.0 g) in isopropanol (600 ml). The solvents were decanted and the solids were washed by stirring for 10 minutes in 600 ml of isopropanol and quickly dissolved in water to give 35 ml of a solution of Polymer 18 (11.1% solids). Analysis by ion chromatography showed >90% conversion to the chloride.

Preparation of Polymer 19: Poly (N,N,N,N-p-vinylbenzyl(2-trimethylammoniumethyl) dimethylammonium dichloride-co-aminopropylmethacrylamide hydrochloride) (9:1 molar ratio)

A] N,N,N,N-p-vinylbenzyl(2-dimethylaminoethyl) dimethylammonium chloride 4-vinylbenzyl chloride (202.30 g, 1.33 mol), acetone (480 ml), diethyl ether (720 ml), N,N,N',N'-tetramethylethylene diamine (210.8 ml, 1.40 mol), and tetrabutylammonium iodide (0.20 g, $5.4\times10^{-4}$ mol) were combined in a 3 liter round-bottomed flask equipped with a mechanical stirrer and a nitrogen inlet. The reaction solution was stirred overnight at room temperature at which point a large amount of white precipitate had formed. The precipitate was recovered by vacuum filtration, washed three times with diethyl ether, and dried for six hours in a vacuum oven at 60° C. to afford 256.1 g of a white powder that was pure to $^1H$ NMR analysis. An additional 56.1 g of material was recovered through concentration of the mother liquors (87.6% yield total).

B] N,N,N,N-p-vinylbenzyl(2-trimethylammoniumethyl) dimethylammonium monoiodide monochloride N,N,N,N-p-vinylbenzyl(2-dimethylaminoethyl) dimethylammonium chloride (256.0 g, 0.95 mol) was dissolved in absolute ethanol (750 ml) in a 2 liter three-neck round-bottom flask. Methyl iodide (72.0 ml, 1.2 mol) was added and the reaction was allowed to stir at room temperature overnight, at which point a large amount of white precipitate had formed. The solids were recovered by vacuum filtration, washed twice with diethyl ether and dried for six hours in a vacuum oven at 60° C. to afford the pure product (274.61 g, 70%).

C] Poly (N,N,N,N-p-vinylbenzyl(2-trimethylammoniumethyl) dimethylammonium dichloride-co-aminopropylmethacrylamide hydrochloride) (9:1 molar ratio)

N,N,N,N-p-vinylbenzyl(2-trimethylammoniumethyl) dimethylammonium monoiodide monochloride (20.00 g,) was dissolved in 250 ml methanol and swirled with DOWEX® 1x8–50 ion exchange resin until all of the monomer had dissolved. The resin was filtered and washed twice with methanol. The combined filtrates were concentrated on a rotary evaporator until a weight of 83.8 g was obtained. Aminopropylmethacrylamide hydrochloride (1.53 g, $8.56\times10^{-3}$ mol) and AIBN (0.22 g, $1.33\times10^{-3}$ mol) were combined with the ion exchanged monomer solution in a round-bottomed flask and sealed with a rubber septum fitted with a plastic strap tie. The solution was bubble degassed with nitrogen for ten minutes and heated at 60° C. overnight in a thermostatted water bath. The polymer solution was dialyzed for four hours, passed through a column containing 300 cc of DOWEX® 1x8–50 ion exchange resin and concentrated to a 17.0% (w/w) solution in methanol. Titration with hexadecyltrimethylammonium hydroxide indicated that the desired Polymer 19 contained 9.97 mol % of aminopropylmethacrylamide hydrochloride.

Preparation of Polymer 20: Poly (vinylbenzyl trimethylammonium chloride-co-methacrylic acid) (94:6 molar ratio)

Vinylbenzyl trimethylammonium chloride (19.58 g, $9.25\times10^{-2}$ mol), methacrylic acid (0.42 g, $4.87\times10^{-3}$ mol), AIBN (0.2 g, $1.22\times10^{-3}$ mol) and methanol (30 ml), were combined in a 100 ml round-bottomed flask sealed with a rubber septum and a plastic strap tie. The polymerization solution was bubble degassed with nitrogen for ten minutes and heated overnight at 60° C. in a thermostatted water bath. The solution was diluted to ~10% solids with water, precipitated once into isopropyl ether and once into diethyl ether, and dried in a vacuum oven at 60° C. 15.4 g (77%) of the product as a white powder was isolated. Titration with hexadecyltrimethylammonium hydroxide indicated that the desired Polymer 20 contained 5.9 mol % of methacrylic acid.

Synthesis of IR Dyes

Synthesis of IR Dye 4:

The synthesis of IR Dye 4 has been reported in U.S. Pat. No. 4,871,656 (Parton et al, see Example 1) wherein it is identified as Dye 1. The material obtained using the synthetic method was 100% pure as determined by HPLC. $\lambda_{max}$=782 (methanol), $\epsilon_{max}$=$23.85\times10^{4}$.

Synthesis of IR Dye 6:

The preparation of IR Dye 6 is identified as "Comparison" in TABLE II in U.S. Pat. No. 4,871,656 (noted above). It was prepared similarly to Dye 2 in that patent (see Example 2). Thus, instead of 2-chloro-ethanesulfonyl as a reactant in the preparation, IR Dye 6 was prepared using 2,4-butane sultone (Aldrich Chemical Co.) as a reactant in the preparation of Intermediate B. Crude dye material was obtained by precipitation of the dye reaction product with ethyl ether. This precipitate was dissolved in a minimal amount of methanol/water mixture (50:50) and potassium acetate that had been previously dissolved in methanol was added. A solid precipitated immediately and was collected and dissolved in a minimal amount of boiling methanol/water mixture. The solution was filtered and then allowed to cool. The resulting IR Dye 6 was collected and dried at 65° C. under high vacuum (<1 mm Hg) for 16 hours. $\lambda_{max}$ 738 nm, $\epsilon_{max}$ $15.34\times10^{4}$.

Synthesis of IR Dye 1:

IR Dye 1 is described in U.S. Pat. No. 5,871,656 (noted above) as Dye 4 in TABLE III. The preparation was carried out similar to that described in Example 1 of the noted patent. A solid precipitate was obtained from the dye reaction (20 g). The solid was heated for 2 minutes in boiling methanol (200 ml) and sodium acetate (20 g) was added in water. The solid was washed with isopropanol and then ethanol and finally ether and dried at 65° C. under high vacuum (<1 mm Hg) for 16 hours. $\lambda_{max}$=804 nm, $\epsilon_{max}$=$22.80\times10^{4}$. The resulting IR dye was 97% pure as determined by high pressure liquid chromatography (HPLC).

Synthesis of IR Dye 2:

IR Dye 2 is identified as Dye 3 in U.S. Pat. No. 4,871,656 (noted above), and was prepared as follows using the intermediates 16 and 17:

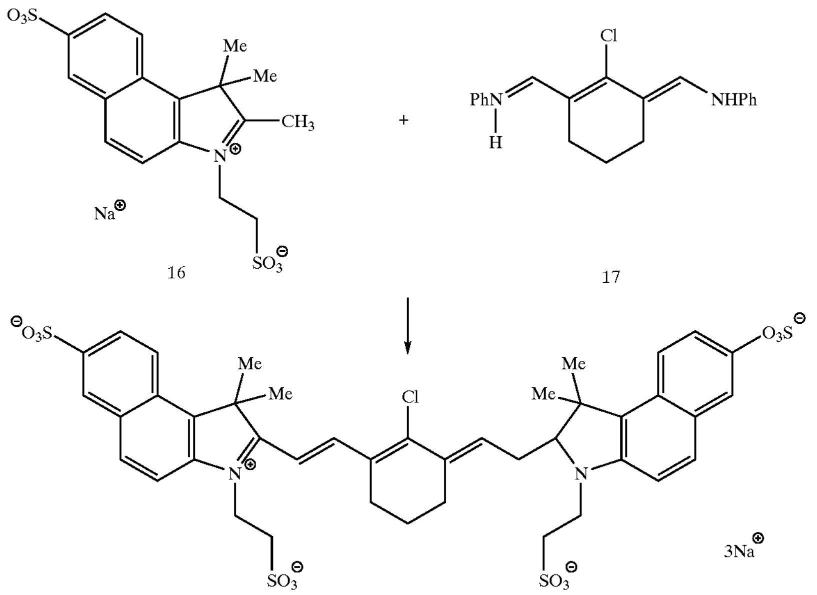

16 17

The intermediates 16 and 17 were prepared using known starting materials and procedures. They [16 (200 g) and 17 (84 g)] were added to a 5-liter round bottom flask containing isopropanol (1 liter), water (1 liter), sodium acetate (300 g) and acetic anhydride (300 ml). The reaction vessel was fitted with a mechanical stirrer and heated to reflux via a heating mantle for 5 minutes. The mixture was cooled to 5° C. in an ice/acetone bath. The precipitated solid was collected by filtration and washed with isopropanol. The resulting solid dye (125 g) was then suspended in $CH_3OH$ (1 liter) and boiled. The mixture was allowed to cool to 40° C. and again collected by filtration. The solid material was rinsed with copious amounts of $CH_3OH$/ethyl ether, and dried at 40° C. under low vacuum to yield 76 g of IR Dye 2. The material was analyzed by HPLC and determined to be ~98% pure. $\lambda_{max}$=821 nm, $\epsilon_{max}$=22.92×10$^4$.

Synthesis of IR Dye 3:

The synthesis of IR Dye 3 was carried using an analogous procedure to that used to prepare IR Dye 2. The work-up of the dye was modified in the following way. A 5.3 g sample of the crude IR dye was heated to boiling in ethanol (25 ml) and $H_2O$ (7 ml) was added. The mixture was cooled to 10° C. and filtered. The IR dye was then washed with an ethanol/water mixture (3:1), then washed with ethyl ether, and dried at 40° C. in a vacuum oven at low vacuum for 12 hours. Weight=1.45 g, $\lambda_{max}$=802 nm (methanol), $\epsilon_{max}$= 22.84×10$^4$. The material was 90% pure as determined by HPLC.

Synthesis of IR Dye 5:

A sample of IR Dye 2 (5 g) was suspended in N,N-dimethylformamide (30 ml) and stirred at room temperature. A portion of 4-aminothiophenol (10 g, Aldrich Chemical Company), was added in liquid form (obtained by melting the commercial solid). After 16 hours at room temperature the reaction had only proceeded 50% to completion. Pyridine (5 ml) was added and the reaction mixture was heated for 2 hours at 70° C. then stirred overnight. A red metallic solid was collected by filtration. The solid was suspended in acetic acid (100 ml) and heated to boiling. Water (5 ml) was added and the mixture became homogeneous. The solution was filtered and after cooling to room temperature the filtrate set up as a solid. The solid was collected by filtration and washed three times with 50 ml portions of acetic acid. The solid was dried overnight under a nitrogen atmosphere. A 3.5 g sample of IR Dye 9 was obtained and was determined to be 96% pure by HPLC analysis. $\lambda_{max}$=829 nm, $\epsilon_{max}$=22.90× 10$^4$.

Synthesis of IR Dye 7:

IR Dye 7 was prepared similarly to IR Dye 2 noted above, as follows:

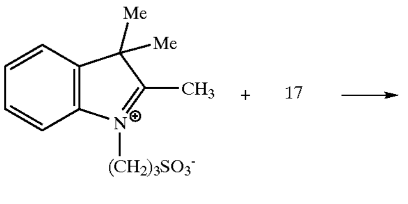

18

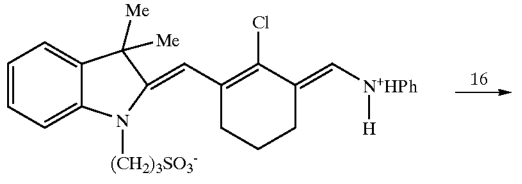

19

IR Dye 7

Intermediate 18, obtained by the alkylation 2,3,3-trimethylindolenine (Aldrich Chemical Co.) with propane sultane (Aldrich Chemical Co.), was heated to boiling with a molar equivalent of intermediate 17 in acetonitrile. A green solid was collected by filtration and dried in a vacuum oven for 16 hours. This intermediate (2.5 g), later determined to be 19, was suspended in isopropanol (50 ml) with acetic anhydride (10 ml) and water (10 ml) and heated to 60° C. Intermediate 16 (2.0 g) was added. Sodium Acetate (2 g) was then added and the solution turned purple. The reaction mixture was heated for 1 hour and then allowed to cool to room temperature. With nucleation by scratching with a stirring rod, a reddish solid (2.5 g) crystallized from the mixture. The solid was dried and determined by NMR to be IR Dye 7. HPLC analysis determined the dye purity to be greater than 92%.

Comparative Example 1

Printing Plate Containing IR Dye A

Polymer 14 (0.508 g) and IR Dye A (0.051 g) identified below were dissolved in a 3:1 mixture (w/w, 8.74 g) of methanol and water. After mixing and just before coating, a solution of bis(vinylsulfonyl)methane (BVSM) crosslinking agent (0.705 g, 1.8% by weight in water) was added. The resulting solution was coated using a conventional wire wound rod (K Control Coater, Model K202, RK Print-Coat Instruments Ltd.) to a wet thickness of 25.4 μm on both a gelatin-subbed polyethylene terephthalate and mechanically grained and anodized aluminum supports. The coatings were dried in an oven for four minutes at 70–80° C. The resulting printing plates comprised a heat-sensitive imaging layer containing crosslinked Polymer 14 (1.08 g/m$^2$) and IR Dye A (108 mg/m$^2$) on either a polyester or aluminum support. The light green coatings on the polyester support exhibited a reddish reflex indicating the presence of crystallites in the coating. Thus, the coatings were not homogeneous.

The printing plates were exposed on a platesetter having an array of laser diodes operating at a wavelength of 830 nm each focused to a spot diameter of 23 mm. Each channel provided a maximum of 450 mWatts (mW) of power incident upon the recording surface. The plates were mounted on a drum whose rotation speed was varied to provide for a series of images set at various exposures as listed TABLE I below. The laser beams were modulated to produce halftone dot images.

TABLE I

| Image | IMAGING POWER (mW) | IMAGING EXPOSURE (mJ/cm$^2$) |
|---|---|---|
| 1 | 356 | 360 |
| 2 | 356 | 450 |
| 3 | 356 | 600 |
| 4 | 356 | 900 |

The exposed printing plates were mounted on a commercial A.B. Dick 9870 duplicator press and prints were made using VanSon Diamond Black lithographic printing ink and Universal Pink fountain solution containing PAR alcohol substitute (Varn Products Company). In the case of the plates having a polyester support, the exposed areas of the printing plates readily accepted ink and printed over 500 impressions of good quality at all exposure conditions, even though the optimum exposure was clearly above 360 mJ/cm2. In the case of the plate having an aluminum support, no substantial image was obtained at any of the exposure conditions.

IR Dye A

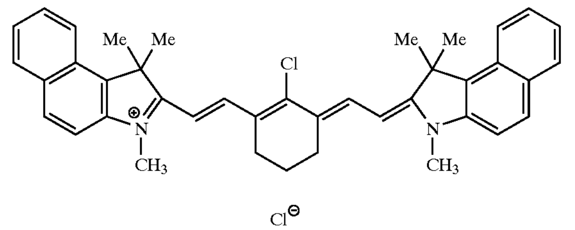

IR Dye B

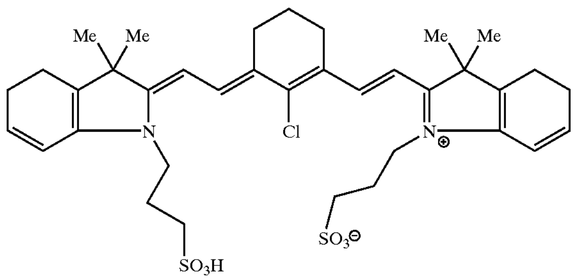

Comparative Example 2

Printing Plate Containing IR Dye B

Polymer 14 (0.508 g) and IR Dye B (0.051 g) identified above were dissolved in a 3:1 mixture (w/w, 8.74 g) of methanol and water. After mixing and just before coating, a solution of BVSM (0.705 g, 1.8% by weight in water) was added, and the resulting solution was coated using a conventional wire wound rod (K Control Coater, Model K202, RK Print-Coat Instruments Ltd.) to a wet thickness of 25.4 $\mu$m on a gelatin-subbed polyethylene terephthalate support. The coatings were dried in an oven for four minutes at 70–80° C. The printing plates comprised a heat-sensitive imaging layer containing crosslinked Polymer 14 (1.08 $g/m^2$) and IR Dye B (108 $mg/m^2$) on a polyester support. The imaging layer was clear and blue-green in color (apparently free of crystallites).

The resulting printing plate was exposed as described in Comparative Example 1. A negative image came up early in the press run but scumming was quickly observed and the plate provided only a very poor image through 1000 impressions.

Comparative Example 3

Printing Plate Containing IR Dye C

Polymer 14 (0.508 g) and IR Dye C (0.051 g) identified below were dissolved in a 3:1 mixture (w/w, 8.74 g) of methanol and water. After mixing and just before coating, a solution of BVSM (0.705 g, 1.8% by weight in water) was added. The resulting solution was coated using a conventional wire wound rod (K Control Coater, Model K202, RK Print-Coat Instruments Ltd.) to a wet thickness of 25.4 $\mu$m on both gelatin-subbed polyethylene terephthalate and mechanically grained and anodized aluminum supports. The coatings were dried in an oven for four minutes at 70–80° C. The resulting printing plates comprised a heat-sensitive imaging layer containing crosslinked Polymer 14 (1.08 $g/m^2$) and IR Dye C (108 $mg/m^2$) on either a polyester or aluminum support. The light green coatings on the polyester support were clear and free of reflex, indicating the absence of crystallites.

The printing plates were exposed and used in printing as described in Comparative Example 1. Both types of plates readily accepted ink in the exposed areas and were used to print over 500 impressions of good quality at all exposure conditions. Neither type of plate exhibited scumming in the background of the prints.

However, during the press run the green color in both types of plates disappeared as IR Dye C was washed out of the polymer imaging layers by the aqueous fountain solution.

IR Dye C

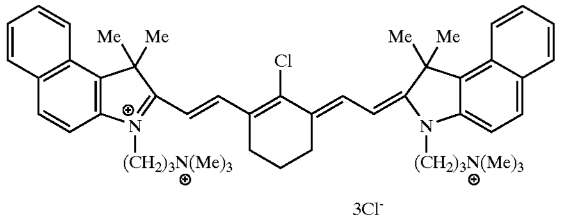

Comparative Example 4

Printing Plate Containing IR Dye B

Polymer 14 (0.435 g) and IR Dye B (0.043 g) were dissolved in a 9:1 mixture (w/w, 8.92 g) of water and methanol. After mixing and just before coating, a solution of BVSM (0.604 g, 1.8% by weight in water) was added. The resulting solution was coated using a conventional wire wound rod (K Control Coater, Model K202, RK Print-Coat Instruments Ltd.) to a wet thickness of 25.4 $\mu$m on both gelatin-subbed polyethylene terephthalate and mechanically grained and anodized aluminum supports. The coating formulation was not totally homogeneous, but left a dark residue on the walls of the vial. The coatings were dried in an oven for four minutes at 70–80° C. The printing plates comprised a heat-sensitive imaging layer containing crosslinked Polymer 14 (1.08 $g/m^2$) and IR Dye B (108 $mg/m^2$) polyester and aluminum supports. The imaging layers were clear and had a blue green color (apparently free of crystallites).

The printing plates were exposed and used in printing as described in Comparative Example 1. Negative images came up early in the press run. The plate having the polyester support appeared much more sensitive to laser exposure than the plate having an aluminum support. Scumming was observed early in the press runs but lessened as the color of the plates was bleached, suggesting that the dye was gradually being washed out by the fountain solution.

Comparative Example 5

Printing Plate Containing IR Dye D

Polymer 14 (0.720 g) and IR Dye D (shown below, 0.072 g) were dissolved in a 1:1 mixture (w/w, 13.2 g) of methanol and water. After mixing and just before coating, a solution of BVSM (1 g, 1.8% by weight in water) was added, and the resulting solution was coated using a conventional wire wound rod (K Control Coater, Model K202, RK Print-Coat Instruments Ltd.) to a wet thickness of 25.4 $\mu$m on both gelatin-subbed polyethylene terephthalate and mechanically grained and anodized aluminum supports. The coatings were dried in an oven for four minutes at 70–80° C. Thus, printing plates comprised a heat-sensitive imaging layer containing crosslinked Polymer 14 (1.08 $g/m^2$) and IR Dye D (108 $mg/m^2$) were provided on both polyester and aluminum support.

The printing plates were exposed in the experimental platesetter and run on the AB Dick duplicator press as described in Comparative Example 1. Negative images came up early in the press runs but quickly exhibited moderate (aluminum plate) to severe (polyester plate) scum and afforded only very poor images through 500 impressions. Furthermore, during the press run much of the green color on both the aluminum and polyester plates caused by the presence of IR Dye D disappeared as the dye was washed from the polymer coatings by the aqueous fountain solution.

IR Dye D

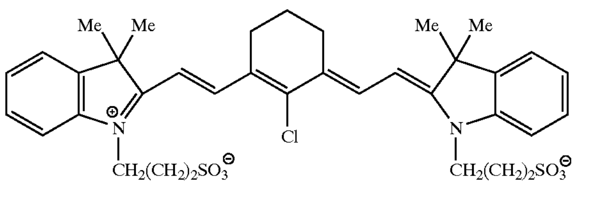

EXAMPLE 1

Printing Plate Containing IR Dye 1

Polymer 14 (0.435 g) and IR Dye 1 (0.043 g) were dissolved in a 9:1 mixture (w/w, 8.92 g) of water and methanol. After mixing and just before coating, a solution of BVSM (0.604 g, 1.8% by weight in water) was added. The resulting solution was coated using a conventional wire wound rod (K Control Coater, Model K202, RK Print-Coat Instruments Ltd.) to a wet thickness of 25.4 μm on both gelatin-subbed polyethylene terephthalate and mechanically grained and anodized aluminum supports. Unlike in Comparative Example 4, it was noted that the coating formulation was totally homogeneous. The coatings were dried in an oven for four minutes at 70–80° C. The printing plates comprised heat-sensitive imaging layers containing crosslinked Polymer 14 (1.08 g/m$^2$) and IR Dye 1 (108 mg/m$^2$) on either polyester or aluminum supports. The resulting plates were clear and light green in color (apparently free of crystallites).

The printing plates were exposed and used in printing as described in Comparative Example 1. Unlike in Comparative Example 1, the exposed areas of both types of plates readily accepted ink and printed over 1000 impressions of good quality at all exposure conditions. Neither type of plate exhibited scumming in the background of the prints. Furthermore, unlike in the comparative examples the green color of the IR dye remained in the plates throughout the press run indicating that it was not washed away by the fountain solution.

EXAMPLE 2

Printing Plate Containing IR Dye 6

Polymer 14 (0.435 g) and IR Dye 6 (0.043 g) were dissolved in a 9:1 mixture (w/w, 8.92 g) of water and methanol. After mixing and just before coating, a solution of BVSM (0.604 g, 1.8% by weight in water) was added. The resulting solution was coated using a conventional wire wound rod (K Control Coater, Model K202, RK Print-Coat Instruments Ltd.) to a wet thickness of 25.4 μm on both gelatin-subbed polyethylene terephthalate and mechanically grained and anodized aluminum supports. Unlike in Comparative Example 4, the coating formulation was totally homogeneous. The coatings were dried in an oven for four minutes at 70–80° C. The printing plates comprised heat-sensitive imaging layers containing crosslinked Polymet 14 (1.08 g/m$^2$) and Dye 6 (108 mg/m$^2$) on polyester or aluminum supports. The plates were clear and had a light blue color (apparently free of crystallites).

The printing plates were exposed and used in printing as described in Comparative Example 1. However unlike the plates in Comparative Example 2, the exposed areas of both types of plates readily accepted ink and printed over 1000 impressions of good quality. Neither type of plate exhibited scumming in the background of the prints. Furthermore, unlike in the comparative examples, the blue color of the IR dye remained on the plates throughout the press run, indicating that it was not washed away by the fountain solution.

EXAMPLE 3

Printing Plate Containing IR Dye 1

Polymer 14 (0.762 g) and IR Dye 1 (0.076 g) were dissolved in a 3:1 mixture (w/w, 13.1 g) of methanol and water. After mixing and just before coating, a solution of BVSM (1.058 g, 1.8% by weight in water) was added, and the resulting solution was coated using a small hopper coater to a wet coverage of 25.5 cm$^3$/m$^2$ on both gelatin-subbed polyethylene terephthalate and mechanically grained and anodized aluminum supports. The coatings were dried in an oven for four minutes at 70–80° C. The printing plates comprised heat-sensitive imaging layers containing crosslinked Polymer 14 (1.08 g/m$^2$) and IR Dye 1 (108 mg/m$^2$) on the polyester and aluminum support. The plates were clear and had a light green color (apparently free of crystallites).

The printing plates were exposed and used in printing as described in Comparative Example 1. Unlike in Comparative Example 1, the exposed areas of both types of plates readily accepted ink and printed over 750 impressions of good quality. Neither type of plate exhibited scumming in the background of the prints. Furthermore, unlike in the comparative examples, the green color of the IR dye remained on the plates throughout the press run indicating that it was not washed away by the fountain solution.

EXAMPLE 4

Printing Plate Containing IR Dye 2

Printing plates were prepared as described in Example 3 but using IR Dye 2 in place of IR Dye 1. The printing plates were exposed and used in printing as described in Comparative Example 1. The exposed areas of both types of plates readily accepted ink and printed over 750 impressions of good quality. Neither type of printing plate exhibited scumming in the background of the prints. Furthermore, unlike in the comparative examples, the green color of the IR dye remained on the plates throughout the press run indicating that it was not washed away by the fountain solution.

EXAMPLE 5

Printing Plate Containing IR Dye 3

Printing plates were prepared as in Example 3 but using IR Dye 3 in place of IR Dye 1. The printing plates were exposed and used in printing as described in Comparative Example 1. Both types of plates readily accepted ink and printed over 750 impressions of good quality. Neither type of plate exhibited scumming in the background of the prints. Furthermore, unlike in the comparative examples, the green color of the IR dye remained on the plates throughout the press run indicating that it was not washed away by the fountain solution.

EXAMPLE 6

Printing Plate Containing IR Dye 4

Printing plates were prepared as in Example 3 but using IR Dye 4 in place of IR Dye 1. The plates were exposed and used in printing as described in Comparative Example 1. The exposed areas of both types of plates readily accepted ink and printed over 750 impressions of good quality. Neither type of plate exhibited scumming in the background of the prints. Furthermore, unlike in the comparative examples, the light blue green color of the IR dye remained on the plates throughout the press run indicating that it was not washed away by the fountain solution.

EXAMPLE 7

Printing Plate Containing IR Dye 5

Printing plates were prepared as in Example 3 but using IR Dye 5 in place of IR Dye 1. The plates were exposed and used in printing as described in Comparative Example 1. The exposed areas of both types of plates readily accepted ink and printed over 750 impressions of good quality. Neither type of plate exhibited scumming in the background of the prints. Furthermore, unlike in the comparative examples, the light green color of the IR dye remained on the plates throughout the press run indicating that it was not washed away by the fountain solution.

EXAMPLE 8

Printing Plate Containing Alternate Polymer and IR Dye 1

Polymer 19 (4.73 g of 17% methanol solution) and IR Dye 1 (0.080 g) were mixed in methanol (7.96 g). After mixing and just before coating, a solution of BVSM (2.232 g, 1.8% by weight in water) was added along with an additional 1.3 g of water. The resulting solution was coated using a small hopper coater to a wet coverage of 25.5 $cm^3/m^2$ on both gelatin-subbed polyethylene terephthalate and mechanically grained and anodized aluminum supports. The coatings were dried in an oven for four minutes at 70–80° C. Thus, printing plates comprised heat-sensitive imaging layers containing crosslinked Polymer 19 (1.08 $g/m^2$) and IR Dye 1 (108 $mg/m^2$) were provided on polyester and aluminum supports. The plates were clear and had a light green color (apparently free of crystallites).

The printing plates were exposed and used in printing as described in Comparative Example 1. The exposed areas of both types of plates readily accepted ink and printed over 500 impressions of good quality. Neither type of plate exhibited scumming in the background of the prints. The light green color remained on the plates throughout the press run indicating that the IR dye was not washed away by the fountain solution.

EXAMPLE 9

Printing Plate Containing Alternate Polymer and Dye 1

Polymer 20 (0.652 g) and IR Dye 1 (0.065 g) were dissolved in a 9:1 mixture (w/w, 13.7 g) of water and methanol. After mixing and just before coating, a solution of CX-100 crosslinking agent (Zeneca Resins, 0.587 g, 5.0% by weight in methanol) was added. The resulting solution was coated on a gelatin-subbed polyethylene terephthalate support using a small hopper coater to a wet coverage of 25.5 $cm^3/m^2$. The coatings were dried in an oven for four minutes at 70–80° C. The printing plates comprised a heat-sensitive imaging layer containing crosslinked Polymer 20 (1.08 $g/m^2$) and IR Dye 1 (108 $mg/m^2$) on a polyester support. The plates were clear and had a light green color (apparently free of crystallites).

The plate was exposed and used in printing as described in Comparative Example 1. The exposed areas of the plate readily accepted ink and printed over 1000 impressions of good quality. Scumming was not observed in the background of the prints. The light green color of the IR dye remained in the plate throughout the press run indicating that it was not washed away by the fountain solution.

EXAMPLE 10

Printing Plate Containing IR Dye 2

Printing plates were prepared as in Comparative Example 5 but using IR Dye 2 in place of IR Dye D.

As in Comparative Example 1, the printing plates were exposed on the experimental platesetter and run on the commercial A. B. Dick 9870 duplicator press. The exposed areas of both the aluminum and polyester plates readily accepted ink and printed over 500 impressions of very good quality at all exposure conditions. Unlike with IR Dye D in Comparative Example 5, neither the aluminum nor the polyester printing plates exhibited scumming in the background of the prints. Furthermore, unlike in the comparative examples the green color of the dye remained on the plates throughout the press run indicating that it was not washed away by the fountain solution.

EXAMPLE 11

Printing Plate Containing IR Dye 7

Printing plates were prepared as in Comparative Example 5 but using IR Dye 7 in place of IR Dye D.

As in Comparative Example 1, the printing plates were exposed on the experimental platesetter and run on the commercial A.B. Dick 9870 duplicator press. The exposed areas of both the aluminum and polyester plates readily accepted ink and printed over 500 impressions of very good quality at all exposure conditions. Unlike with Dye D in Comparative Example 5, neither the aluminum nor the polyester printing plates exhibited scumming in the background of the prints. Furthermore, unlike in the comparative examples the green color of the dye remained on the plates throughout the press run indicating that it was not washed away by the fountain solution.

The invention has been described in detail with particular reference to preferred embodiments thereof, but it will be understood that variations and modifications can be effected within the spirit and scope of the invention.

We claim:

1. A method of imaging comprising the steps of:

A) providing an imaging member comprising a support having disposed thereon a hydrophilic imaging layer, and B) imagewise exposing said imaging member to provide exposed and unexposed areas in the imaging layer of said imaging member, whereby said exposed areas are rendered more hydrophobic than said unexposed areas by heat provided by said imagewise exposure, said hydrophilic imaging layer being prepared from a) a hydrophilic heat-sensitive ionomer, b) water or a water-miscible organic solvent, and c) an infrared radiation sensitive dye that is soluble in water or said water-miscible organic solvent, wherein the infrared radiation sensitive dye comprises an organic moiety comprising an infrared sensitive group and at least three sulfo groups covalently bound to the organic moiety, wherein said heat-sensitive ionomer is selected from the following two classes of polymers:

I) a crosslinked or uncrosslinked vinyl polymer comprising recurring unites comprising positively-charged, pendant N-alkylated aromatic heterocyclic groups represented by the Structure I

I

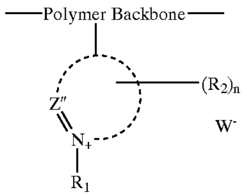

wherein $R_1$ is an alkyl group, $R_2$ is an alkyl group, an alkoxy group, an aryl group, an alkenyl, halo, a cycloalkyl group, or a heterocyclic group having 5 to 8 atoms in the ring, Z" represents the carbon and nitrogen, oxygen, or sulfur atoms necessary to complete an aromatic N-heterocyclic ring having 5 to 10 atoms in the ring, n is 0 to 6, and $W^-$ is an anion, and II) a crosslinked polymer comprising recurring organoonium groups represented by the structure VI:

VI

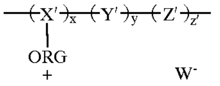

wherein ORG represents organoonium groups, X' represents recurring units to which the ORG groups are attached, Y' represents recurring units derived from ethylenically unsaturated polymerizable monomers that may provide active sites for crosslinking, Z' represents recurring units derived from any additional ethylenically unsaturated polymerizable monomers, x' is from about 20 to about 99 mol %, y' is from about 1 to about 20 mol % and z' is from 0 to about 79 mol %.

2. The method of claim 1 wherein said imagewise exposing is carried out using an IR radiation emitting laser, and said imaging member is a lithographic printing plate having an aluminum support or an imaging cylinder.

3. The method of claim 1 wherein said imagewise exposing is accomplished using a thermal head.

4. The method of claim 1 wherein said IR dye is a cyanine dye having two nitrogen atoms conjugated with a polymethine chain that is terminated with two cyclic groups.

5. The method of claim 4 wherein said polymethine chain is conjugated with one or more aromatic carbocyclic or aromatic or non-aromatic heterocyclic groups.

6. The method of claim 1 wherein said IR dye is represented by Structure DYE-1:

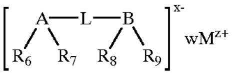

wherein A and B are independently cyclic groups, L is a chromophoric chain comprising at least 3 carbon atoms that is conjugated to A and B, $R_6$, $R_7$, $R_8$ and $R_9$ are independently substituents selected from the group consisting of sulfo, alkyl, alkoxy, halo, carboxy, and aryl groups, M is a cation, $x^-$ is the overall anionic charge, and w and z are integers to provide positive charge to balance $x^-$.

7. The method of claim 6 wherein,A and B are independently phenyl, naphthyl, tolyl, pyridyl, pyrimidyl, quinolinyl, phenanthridyl, indolyl, benzindolyl or naphthindolyl groups.

8. The method of claim 7 wherein A and B are independently phenyl, naphthyl, indolyl, benzindolyl or naphthindolyl groups, L comprises at least 5 carbon atoms.

9. The method of claim 8 wherein A and B are independently indolyl or benzindolyl groups, and L has from 7 to 9 carbon atoms.

10. The method of claim 1 wherein said water or water-miscible organic solvent comprises water, methanol, ethanol, 1-methoxy-2-propanol, or a mixture of two or more of these.

11. The method of claim 1 wherein $R_1$ is an alkyl group of 1 to 6 carbon atoms, $R_2$ is a methyl, ethyl or n-propyl group, Z" represents the carbon and nitrogen, oxygen, or sulfur atoms to complete a 5-membered ring, and n is 0 or 1.

12. The method of claim 1 wherein x' is from about 30 to about 98 mol %, y' is from about 2 to about 10 mol % and z' is from 0 to about 68 mol %.

13. The method of claim 1 wherein said heat-sensitive polymer is present at from about 1 to about 10% solids, and said IR dye is present at from about 0.1 to about 1% solids.

14. A method of printing comprising the steps of:

A) providing an imaging member comprising a support having disposed thereon a hydrophilic imaging layer, B) imagewise exposing said imaging member to provide exposed and unexposed areas in the imaging layer of said imaging member, whereby said exposed areas are rendered more hydrophobic than said unexposed areas by heat provided by said imagewise exposure, and C) contacting said imagewise exposed imaging member with a lithographic printing ink, and imagewise transferring said printing ink to a receiving material, said hydrophilic imaging layer being prepared from a) a hydrophilic heat-sensitive ionomer, b) water or a water-miscible organic solvent, and c) an infrared radiation sensitive dye that is soluble in water or said water-miscible organic solvent, wherein the infrared radiation sensitive dye comprises an organic moiety comprising an infrared sensitive group and at least three sulfo groups covalently bound to the organic moiety;

wherein said heat-sensitive ionomer is selected from the following two classes of polymers:

I) a crosslinked or uncrosslinked vinyl polymer comprising recurring units comprising positively-charged, pendant N-alkylated aromatic heterocyclic groups represented by the Structure I

I

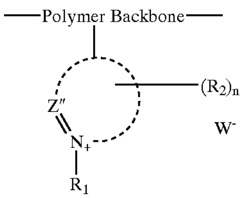

wherein $R_1$ is an alkyl group, $R_2$ is an alkyl group, an alkoxy group, an aryl group, an alkenyl, halo, a cycloalkyl group, or a heterocyclic group having 5 to 8 atoms in the ring, Z" represents the carbon and nitrogen, oxygen, or sulfur atoms necessary to complete an aromatic N-heterocyclic ring having 5 to 10 atoms in the ring, n is 0 to 6, and $W^-$ is an anion, and II) a crosslinked polymer comprising recurring organoonium groups epresented by the structure VI:

VI

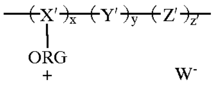

wherein ORG represents organoonium groups, X' represents recurring units to which the ORG groups are attached, Y' represents recurring units derived from ethylenically unsaturated polymerizable monomers that may provide active sites for crosslinking, Z' represents recurring units derived from any additional ethylenically unsaturated polymerizable monomers, x' is from about 20 to about 99 mol %, y' is from about 1 to about 20 mol %, and z' is from 0 to about 79 mol %.

15. A method of imaging comprising the steps of:

A) spray coating a heat-sensitive composition onto a support to provide an imaging member, and B) imagewise exposing said imaging member to provide exposed and unexposed areas in the imaging layer of said imaging member, whereby said exposed areas are rendered more hydrophobic than said unexposed areas by heat provided by said imagewise exposure, said heat-sensitive composition comprising:

a) a hydrophilic heat-sensitive ionomer, b) water or a water-miscible organic solvent, and c) an infrared radiation sensitive dye that is soluble in water or said water-miscible organic solvent, wherein the infrared radiation sensitive dye comprises an organic moiety comprising an infrared sensitive group and at least three sulfo groups covalently bound to the organic moiety, wherein said heat-sensitive ionomer is selected from the following two classes of polymers:

I) a crosslinked or uncrosslinked vinyl polymer comprising recurring units comprising positively-charged, pendant N-alkylated aromatic heterocyclic groups represented by the Structure I

I

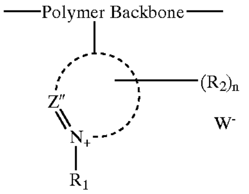

wherein $R_1$ is an alkyl group, $R_2$ is an alkyl group, an alkoxy group, an aryl group, an alkenyl, halo, a cycloalkyl group, or a heterocyclic group having 5 to 8 atoms in the atoms in the ring, Z" represents the carbon and nitrogen, oxygen, or sulfur atoms necessary to complete an aromatic N-heterocyclic ring having 5 to 10 atoms in the ring, n is 0 to 6, and $W^-$ is an anion, and II) a crosslinked polymer comprising recurring organoonium groups represented by the structure VI:

VI

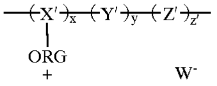

wherein ORG represents organoonium groups, X' represents recurring units to which the ORG groups are attached, Y' represents recurring units derived from ethylenically unsaturated polymerizable monomers that may provide active sites for crosslinking, Z' represents recurring units derived from any additional ethylenically unsaturated polymerizable monomers, x' is from about 20 to about 99 mol %, y' is from about 1 to about 20 mol %, and z' is from 0 to about 79 mol %.

16. The method of claim 15 wherein said support is an on-press printing cylinder or sleeve.

17. A method of imaging comprising the steps of:

A) providing an imaging member comprising a support having disposed thereon a hydrophilic imaging layer, and B) imagewise exposing said imaging member to provide exposed and unexposed areas in the imaging layer of said imaging member, whereby said exposed areas are rendered more hydrophobic than said unexposed areas by heat provided by said imagewise exposure, said hydrophilic imaging layer being prepared from a) a hydrophilic heat-sensitive ionomer, b) water or a water-miscible organic solvent, and c) an infrared radiation sensitive dye that is soluble in water or said water-miscible organic solvent and has at least three sulfo groups, wherein said heat-sensitive ionomer is selected from the following two classes of polymers:

I) a crosslinked or uncrosslinked vinyl polymer comprising recurring unites comprising positively-charged, pendant N-alkylated aromatic heterocyclic groups represented by the Structure I

I

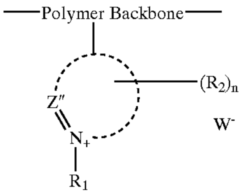

wherein $R_1$ is an alkyl group, $R_2$ is an alkyl group, an alkoxy group, an aryl group, an alkenyl, halo, a cycloalkyl group, or a heterocyclic group having 5 to 8 atoms in the ring, Z" represents the carbon and nitrogen, oxygen, or sulfur atoms necessary to complete an aromatic N-heterocyclic ring having 5 to 10 atoms in the ring, n is 0 to 6, and $W^-$ is an anion, and II) a crosslinked polymer comprising recurring organoonium groups represented by the structure VI:

VI

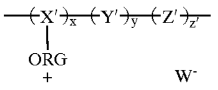

wherein ORG represents organoonium groups, X' represents recurring units to which the ORG groups are attached, Y' represents recurring units derived from ethylenically unsaturated polymerizable monomers that may provide active sites for crosslinking, Z' represents recurring units derived from any additional ethylenically unsaturated polymerizable monomers, x' is from about 20 to about 99 mol %, y' is from about 1 to about 20 mol % and z' is from 0 to about 79 mol %, wherein said infrared radiation sensitive dye is represented by Structure DYE-2

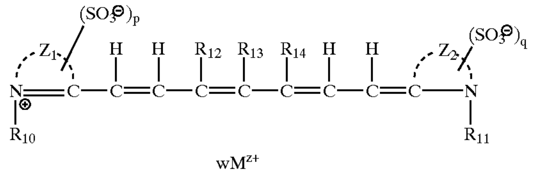

wherein $R_{10}$ and $R_{11}$ are independently sulfo, $R_{12}$ and $R_{14}$ are independently hydrogen, alkyl or aryl groups, or together represent the carbon atoms necessary to complete a 5- to 6-membered carbocyclic ring, $R_{13}$ is hydrogen, or an alkyl, aryl, halo, thioalkyl, thioaryl, cyano, amino or heterocyclic group, p and q are integers of 1 to 3, $Z_1$ and $Z_2$ independently represent the atoms needed to complete an indolyl, benindolyl or naphthindolyl group, M is a cation, and w and z are integers to provide positive charge to balance the total charge of the dye anion.

18. The method of claim 17 wherein $R_{10}$ and $R_{11}$ are independently, sulfoalkyl having 1 to 4 carbon atoms, sulfoalkenyl, sulfoaryl, sulfoalkynyl, or oxysulfonate.

19. A method of imaging comprising the steps of:

A) providing an imaging member comprising a support having disposed thereon a hydrophilic imaging layer, and B) imagewise exposing said imaging member to provide exposed and unexposed areas in the imaging layer of said imaging member, whereby said exposed areas are rendered more hydrophobic than said unexposed areas by heat provided by said imagewise exposure, said hydrophilic imaging layer being prepared from a) a hydrophilic heat-sensitive ionomer, b) water or a water-miscible organic solvent, and c) an infrared radiation sensitive dye that is soluble in water or said water-miscible organic solvent and has at least three sulfo groups, wherein said heat-sensitive ionomer is selected from the following two classes of polymers:

I) a crosslinked or uncrosslinked vinyl polymer comprising recurring unites comprising positively-charged, pendant N-alkylated aromatic heterocyclic groups represented by the Structure I

I

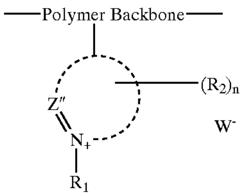

wherein $R_1$ is an alkyl group, $R_2$ is an alkyl group, an alkoxy group, an aryl group, an alkenyl, halo, a cycloalkyl group, or a heterocyclic group having 5 to 8 atoms in the ring, Z" represents the carbon and nitrogen, oxygen, or sulfur atoms necessary to complete an aromatic N-heterocyclic ring having 5 to 10 atoms in the ring, n is 0 to 6, and $W^-$ is an anion, and II) a crosslinked polymer comprising recurring organoonium groups represented by the structure VI:

VI

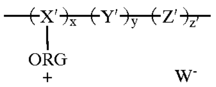

wherein ORG represents organoonium groups, X' represents recurring units to which the ORG groups are attached, Y' represents recurring units derived from ethylenically unsaturated polymerizable monomers that may provide active sites for crosslinking, Z' represents recurring units derived from any additional ethylenically unsaturated polymerizable monomers, x' is from about 20 to about 99 mol %, y' is from about 1 to about 20 mol % and z' is from 0 to about 79 mol %, wherein said infrared radiation sensitive dye is selected from the group consisting of IR Dye 1, IR Dye 2, IR Dye 3, IR Dye 4, IR Dye 5, IR Dye 6, and IR Dye 7:

IR Dye 1

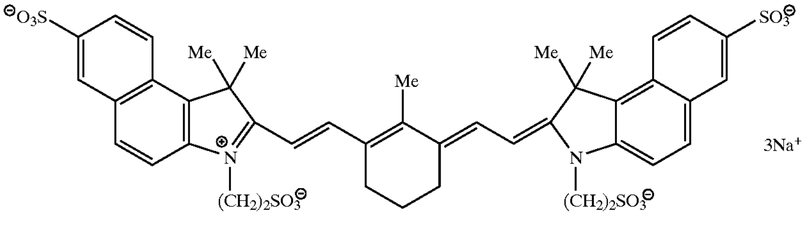

IR Dye 2

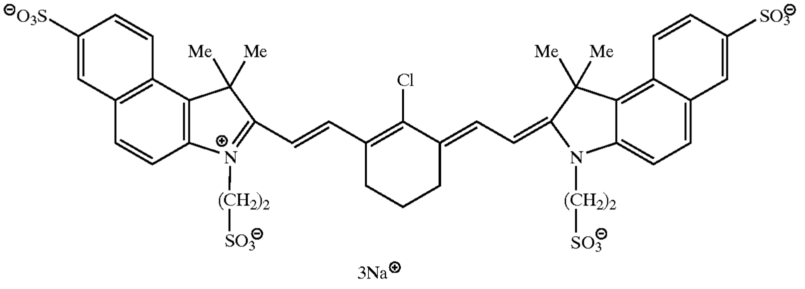

-continued

IR Dye 3

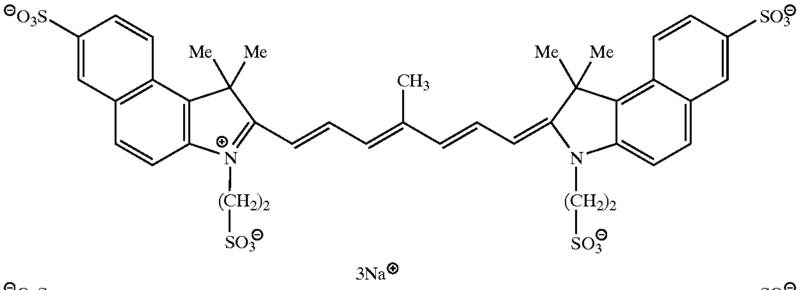

IR Dye 4

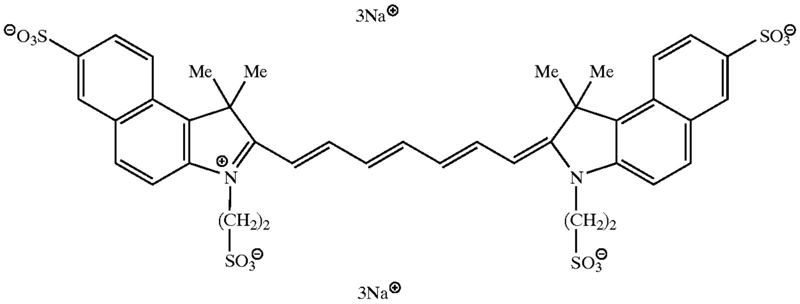

IR Dye 5

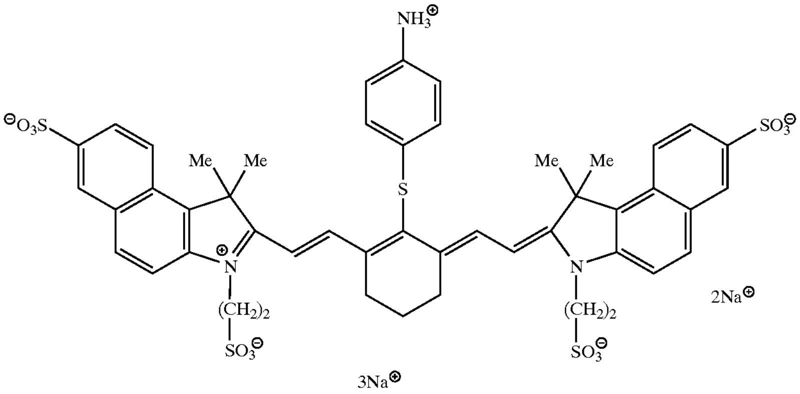

IR Dye 6

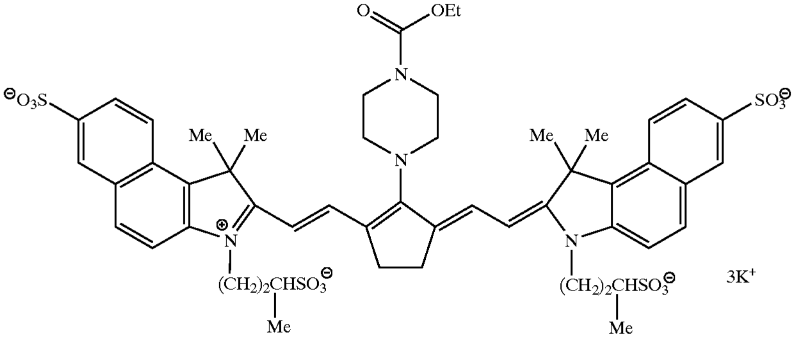

IR Dye 7

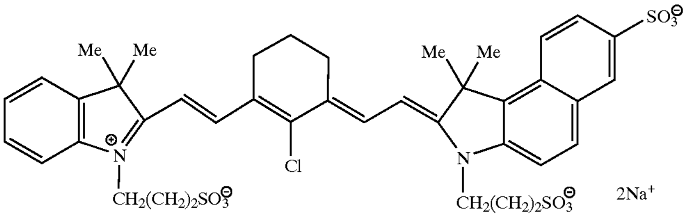

20. A method of imaging comprising the steps of:

A) providing an imaging member comprising a support having disposed thereon a hydrophilic imaging layer, and B) imagewise exposing said imaging member to provide exposed and unexposed areas in the imaging layer of said imaging member, whereby said exposed areas are rendered more hydrophobic than said unexposed areas by heat provided by said imagewise exposure, said hydrophilic imaging layer being prepared from a) a hydrophilic heat-sensitive ionomer, b) water or a water-miscible organic solvent, and c) an infrared radiation sensitive dye that is soluble in water or said water-miscible organic solvent, wherein the infrared radiation sensitive dye comprises an organic moiety comprising an infrared sensitive group and at least three sulfo groups covalently bound to the organic moiety, wherein said heat-sensitive ionomer is a crosslinked polymer represented by either of Structures III or IV:

III

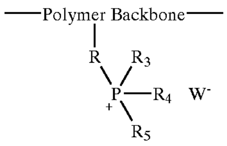

-continued

IV

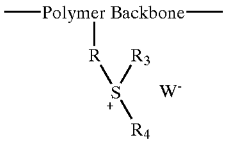

wherein R is an alkylene, arylene, or cycloalkylene group or a combination of two or more such groups, $R_3$, $R_4$ and $R_5$ are independently substituted or unsubstituted alkyl, aryl or cycloalkyl groups, or any two of $R_3$, $R_4$ and $R_5$ can be combined to form a heterocyclic ring with the charged phosphorus or sulfur atom, and $W^-$ is an anion.

21. The method of claim 20 wherein R is an ethyleneoxycarbonyl or phenylenemethylene group, and $R_3$, $R_4$ and $R_5$ are independently a methyl or ethyl group, and $W^-$ is a halide or carboxylate.

* * * * *